United States Patent
Endo et al.

(10) Patent No.: US 8,709,920 B2
(45) Date of Patent: Apr. 29, 2014

(54) METHOD FOR MANUFACTURING SEMICONDUCTOR DEVICE

(75) Inventors: Yuta Endo, Atsugi (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 147 days.

(21) Appl. No.: 13/397,839

(22) Filed: Feb. 16, 2012

(65) Prior Publication Data

US 2012/0217499 A1    Aug. 30, 2012

(30) Foreign Application Priority Data

Feb. 24, 2011   (JP) .................................. 2011-037952

(51) Int. Cl.
*H01L 21/20*    (2006.01)

(52) U.S. Cl.
USPC ........................................... 438/479; 257/57

(58) Field of Classification Search
USPC .................. 438/195, 176, 157, 257
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Thao P. Le

(74) *Attorney, Agent, or Firm* — Eric J. Robinson; Robinson Intellectual Property Law Office, P.C.

(57) ABSTRACT

A method for forming a U-shaped vertically long groove in a region where a channel portion of a transistor is formed to make a channel length longer than an apparent channel length additionally requires a photolithography process for forming a groove; therefore, it has a problem in terms of costs and yield. By forming a three-dimensional channel region with the use of a gate electrode or a structure having an insulating surface, a channel length is made three times or more, preferably five times or more, further preferably ten times or more as long as a channel length when seen from the above.

15 Claims, 13 Drawing Sheets

(56) References Cited

U.S. PATENT DOCUMENTS

| | | | |
|---|---|---|---|
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,645,649 B1* | 1/2010 | Lai et al. | 438/151 |
| 7,674,650 B2 | 3/2010 | Akimoto et al. | |
| 7,732,819 B2 | 6/2010 | Akimoto et al. | |
| 8,268,654 B2* | 9/2012 | Fujikawa et al. | 438/30 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1* | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1* | 6/2009 | Maekawa et al. | 257/43 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110096 | 4/1993 |
| JP | 05-110096 A | 4/1993 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086356 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-245371 A | 9/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

(56) References Cited

OTHER PUBLICATIONS

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008,vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,",SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

(56) References Cited

OTHER PUBLICATIONS

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) ,2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clarks.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kim, IEDM 05: Technical Digest of International Electron Devices Meeting, "Technology for sub-50nm DRAM and NAND Flash Manufacturing," pp. 333-336, Dec. 5, 2005.

* cited by examiner

METHOD FOR MANUFACTURING SEMICONDUCTOR DEVICE

BACKGROUND OF THE INVENTION

1. Field of the Invention

The present invention relates to a semiconductor device which is provided with a circuit including a semiconductor element such as a transistor. For example, the present invention relates to a power device which is mounted on a power supply circuit, a semiconductor integrated circuit including a memory, a thyristor, a converter, an image sensor, or the like, an electro-optical device typified by a liquid crystal display panel, and a light-emitting display device including a light-emitting element; and an electronic device on which any of the above circuit and devices are mounted as a component.

In this specification, a semiconductor device generally refers to a device which utilizes semiconductor characteristics; a semiconductor memory device, an electro-optical device, a light-emitting display device, a semiconductor circuit, and an electronic device are all included in the category of the semiconductor device.

2. Description of the Related Art

As semiconductor memory devices, dynamic random access memories (DRAMs) are well-known products and are currently used in a variety of electronic devices. A memory cell which is a key component in a DRAM includes a read and write transistor and a capacitor.

Circuit patterns for DRAMs, like those for other semiconductor integrated circuits, have been miniaturized in accordance with the scaling law, and there was a time when it was considered difficult to achieve a design rule of 100 nm or less. One of the reasons is that in a transistor having a channel length of 100 nm or less, a punch-through current is likely to flow due to a short-channel effect and the transistor becomes incapable of functioning as a switching element. In order to prevent a punch-through current, a silicon wafer may be doped with an impurity at high concentration. However, this is not an appropriate solution to the problem because it makes a junction leakage current likely to flow between a source and the wafer or between a drain and the wafer and eventually causes a deterioration of memory retention characteristics.

Against such a problem, a method has been considered for reducing the area occupied by one memory cell and also maintaining a channel length so as not to cause a short-channel effect by forming a three-dimensional transistor in the memory cell. Disclosed is one example of a structure in which a U-shaped vertically long groove is formed in a region where a channel portion of a transistor is formed, a gate insulating film is formed along a wall surface in the groove, and a gate electrode is formed so as to fill the groove (see Non-Patent Document 1).

A transistor having a channel portion of such a structure has a long channel length because a current flows between a source region and a drain region via an indirect route across the groove portion. This provides an advantageous effect of reducing the area occupied by a transistor and suppressing a short-channel effect.

REFERENCE

[Non-Patent Document 1] Kinam Kim, "Technology for sub-50 nm DRAM and NAND Flash Manufacturing", International Electron Devices Meeting 2005, IEDM Technical Digest, December 2005, pp. 333-336

SUMMARY OF THE INVENTION

However, the method for forming a U-shaped vertically long groove in a region where a channel portion of a transistor is formed additionally requires a photolithography process for forming a groove; therefore, it has a problem in terms of costs and yield.

In addition, in the case where a gate insulating film or the like is deposited in the vertically long groove, the amount of deposition of the film increases near the entrance of the groove when a sputtering method or a plasma chemical vapor deposition (CVD) method is employed; therefore, the groove is embedded with a deposition material in some cases. Thus, it is necessary to select a deposition method which provides good coverage; specifically, the deposition method is limited to a method such as an atomic layer deposition (ALD) method which is relatively expensive or a thermal oxidation method which can be employed only for a silicon wafer or the like.

Thus, the present invention provides a structure in which a channel length is made longer than an apparent channel length without a vertically long groove.

A technical idea of one embodiment of the present invention is to provide a gate electrode or a structure having an insulating surface over a substrate by forming a three-dimensional channel region so that a channel length L' is made three times or more, preferably five times or more, further preferably ten times or more as long as an apparent channel length L. Note that the apparent channel length L is a distance between a pair of electrodes when seen from the above.

According to one embodiment of the present invention, a semiconductor device includes a gate electrode, a gate insulating film covering the gate electrode, a semiconductor film which is over the gate insulating film and at least partly overlapped with the gate electrode, and a pair of electrodes which is in contact with the semiconductor film and not overlapped with the gate electrode. In the semiconductor device, a channel length L' is made three times or more, preferably five times or more, further preferably ten times or more as long as an apparent channel length L. Note that the apparent channel length L is a distance between the pair of electrodes when seen from the above.

According to another embodiment of the present invention, a semiconductor device includes a first gate electrode, a second gate electrode which overlaps with the first gate electrode and whose top surface is smaller than that of the first gate electrode, a gate insulating film covering the first gate electrode and the second gate electrode, a semiconductor film which is over the gate insulating film and at least partly overlapped with the second gate electrode, and a pair of electrodes which is in contact with the semiconductor film and overlapped with the first gate electrode but not with the second gate electrode. Note that the same material may be used for the first gate electrode and the second gate electrode.

According to another embodiment of the present invention, a semiconductor device includes a structure having an insulating surface; a semiconductor film at least partly overlapped with the structure; a pair of electrodes which is in contact with the semiconductor film and not overlapped with the structure; a gate insulating film covering the semiconductor film; and a gate electrode over the semiconductor film with the gate insulating film provided therebetween. In the semiconductor device, a channel length L' is made three times or more, preferably five times or more, further preferably ten times or more as long as an apparent channel length L. Note that the apparent channel length L is a distance between the pair of electrodes when seen from the above.

As the semiconductor film, an oxide semiconductor film or a crystalline silicon film (a microcrystalline silicon film, a polycrystalline silicon film, or the like) can be formed.

Any material can be used for the structure having an insulating surface as long as it has heat resistance enough to withstand heat treatment performed later. For example, an inorganic compound such as silicon oxide, silicon oxynitride, silicon nitride oxide, silicon nitride, aluminum oxide, aluminum oxynitride, aluminum nitride oxide, or aluminum nitride; or an organic compound such as polyimide can be used. Alternatively, a material having conductivity may be used by subjecting its surface to insulation treatment.

In this specification, silicon oxynitride refers to a substance that contains more oxygen than nitrogen and for example, silicon oxynitride contains oxygen, nitrogen, silicon, and hydrogen at concentrations ranging from higher than or equal to 50 atomic % and lower than or equal to 70 atomic %, higher than or equal to 0.5 atomic % and lower than or equal to 15 atomic %, higher than or equal to 25 atomic % and lower than or equal to 35 atomic %, and higher than or equal to 0 atomic % and lower than or equal to 10 atomic %, respectively. Further, silicon nitride oxide refers to a substance that contains more nitrogen than oxygen and for example, silicon nitride oxide contains oxygen, nitrogen, silicon, and hydrogen at concentrations ranging from higher than or equal to 5 atomic % and lower than or equal to 30 atomic %, higher than or equal to 20 atomic % and lower than or equal to 55 atomic %, higher than or equal to 25 atomic % and lower than or equal to 35 atomic %, and higher than or equal to 10 atomic % and lower than or equal to 25 atomic %, respectively. Note that the above ranges are ranges for cases where measurement is performed using Rutherford backscattering spectrometry (RBS) and hydrogen forward scattering spectrometry (HFS). In addition, the total of the percentages of the constituent elements does not exceed 100 atomic %.

Aluminum oxynitride refers to a substance that contains more oxygen than nitrogen. Further, aluminum nitride oxide refers to a substance that contains more nitrogen than oxygen.

According to one embodiment of the present invention, it is possible to reduce the adverse effect of a short-channel effect and increase an integration degree of a semiconductor device. In addition, a semiconductor device with lower power consumption and higher yield can be provided.

DETAILED DESCRIPTION OF THE INVENTION

Figure 1A:
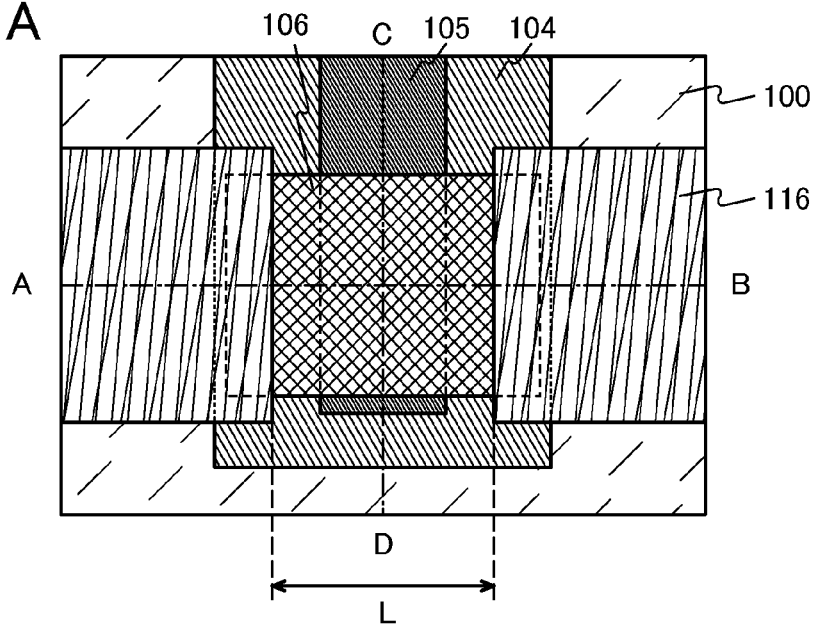
FIGS. 1A to 1C are a top view and cross-sectional views illustrating an example of a semiconductor device which is one embodiment of the present invention.

Embodiments of the present invention will be described below in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a predetermined potential and a reference potential (e.g., a ground potential) in many cases. Accordingly, voltage, potential, and a potential difference can be referred to as potential, voltage, and a voltage difference, respectively.

Further, even when the expression "to be connected" is used in this specification, there is a case in which no physical connection is made in an actual circuit and a wiring is just extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a transistor which is one embodiment of the present invention will be described with reference to FIGS. 1A to 1C.

Figure 1B:
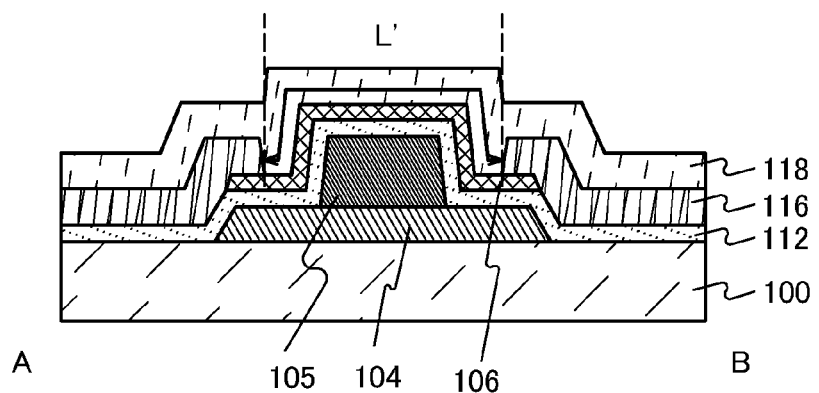
Figure 1C:
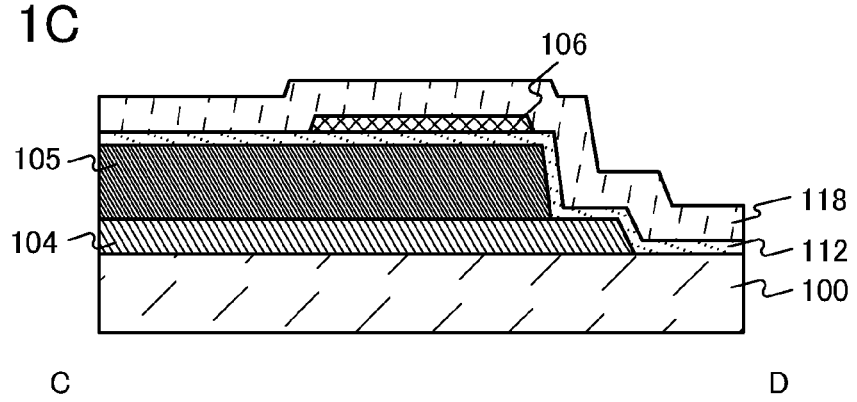

FIG. 1A is a top view of the transistor. A cross section along the dashed-dotted line A-B in FIG. 1A and a cross section along the dashed-dotted line C-D in FIG. 1A correspond to a cross section A-B in FIG. 1B and a cross section C-D in FIG.

1C, respectively. Note that a protective insulating film 118 and a gate insulating film 112 are not illustrated in FIG. 1A for simplicity.

Here, the cross section A-B in FIG. 1B will be described in detail.

The cross-section A-B is a cross section of a transistor including a substrate 100; a first gate electrode 104 over the substrate 100; a second gate electrode 105 which is over the first gate electrode 104 and whose top surface is smaller than that of the first gate electrode 104; the gate insulating film 112 covering the first gate electrode 104 and the second gate electrode 105; a semiconductor film 106 which is over the gate insulating film 112 and at least partly overlapped with the second gate electrode 105; a pair of electrodes 116 which is over the semiconductor film 106 and partly in contact with the semiconductor film 106; and the protective insulating film 118 covering the gate insulating film 112, the semiconductor film 106, and the pair of electrodes 116. Note that a base insulating film may be formed over the substrate.

The widths and heights of the first gate electrode 104 and the second gate electrode 105 are selected as follows. Specifically, the widths and heights can be selected by forming a three-dimensional channel region with the use of the first gate electrode 104 and the second gate electrode 105 so that a channel length L' is made three times or more, preferably five times or more, further preferably ten times or more as long as an apparent channel length L. Note that the apparent channel length L is a distance between the pair of electrodes 116. In order to satisfy the above range, in the cross-sectional shape of the second gate electrode 105, the sum of the lengths of sides of the side surfaces may be made twice or more as long as the length of a side of the top surface.

There is no particular limitation on the substrate 100 as long as it has heat resistance enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like; a compound semiconductor substrate made of silicon germanium or the like; a silicon-on-insulator (SOI) substrate; or the like may be used as the substrate 100. Still alternatively, any of these substrates further provided with a semiconductor element may be used as the substrate 100.

Further alternatively, a flexible substrate may be used as the substrate 100. In that case, a transistor is formed directly on the flexible substrate. Note that as a method for forming a transistor over a flexible substrate, there is also a method in which, after a transistor is formed over a non-flexible substrate, the transistor is separated and transferred to the substrate 100 which is a flexible substrate. In that case, a separation layer is preferably provided between the non-flexible substrate and the transistor.

The first gate electrode 104 and the second gate electrode 105 can be formed to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements. In the case where an oxide is used for the first gate electrode 104 and the second gate electrode 105, nitrogen may be contained at higher than or equal to $5\times10^{19}$ cm$^{-3}$ and lower than or equal to 20 atomic %, preferably higher than or equal to $1\times10^{20}$ cm$^{-3}$ and lower than or equal to 7 atomic %. For example, an oxide film which contains nitrogen at higher than or equal to $1\times10^{20}$ cm$^{-3}$ and lower than or equal to 7 atomic % and also contains In, Ga, and Zn can be used. Since an oxide film has higher resistance than a metal film in the case where an oxide film is used for the first gate electrode 104, it is preferable to use a low-resistance film having a sheet resistance of lower than or equal to 10 Ω/sq for the second gate electrode 105 in order to reduce the resistance of the whole gate electrode (the first gate electrode 104 and the second gate electrode 105). In addition, for the first gate electrode 104 and the second gate electrode 105, it is preferable to use materials in which a difference in work function is within 0.6 eV, preferably 0.2 eV, further preferably 0.1 eV. The difference between the first gate electrode 104 and the second gate electrode 105 in work function within the above range enables the transistor to have more favorable electric characteristics. Note that a concentration using a unit of cm$^{-3}$ is quantified by secondary ion mass spectrometry (SIMS) analysis, and a concentration using a unit of atomic % is quantified by X-ray photoelectron spectroscopy (XPS) analysis. Note that although the first gate electrode 104 and the second gate electrode 105 are separately formed using different materials, the same material may be used for the first gate electrode 104 and the second gate electrode 105 as long as desired shapes can be obtained.

As the semiconductor film 106, an oxide semiconductor film or a crystalline silicon film can be formed by a sputtering method, a plasma CVD method, a pulse laser deposition (PLD) method, a molecular beam epitaxy (MBE) method, an evaporation method, or the like. In the case of using an oxide semiconductor film, a material including two or more kinds of elements selected from In, Ga, Zn, and Sn can be used.

For example, for the oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, an In—Ga—Zn—O-based material means an oxide containing indium (In), gallium (Ga), and zinc (Zn), and there is no particular limitation on the composition ratio. Further, the material may contain an element other than In, Ga, and Zn. In this case, the amount of oxygen in the oxide semiconductor film is preferably in excess of the stoichiometric proportion. When the amount of oxygen is in excess of stoichiometric proportion, carrier generation which results from oxygen vacancy in the oxide semiconductor film can be suppressed.

For example, in the case where an In—Zn—O-based material is used for the oxide semiconductor film, the atomic ratio thereof is set so that In/Zn is greater than or equal to 0.5 and less than or equal to 50, preferably greater than or equal to 1 and less than or equal to 20, more preferably greater than or equal to 1.5 and less than or equal to 15. When the atomic ratio of Zn is in the above range, the field effect mobility of the transistor can be improved. Here, when the atomic ratio of the compound is In:Zn:O=X:Y:Z, the relation of Z>1.5X+Y is preferably satisfied.

Alternatively, a material represented by a chemical formula, InMO$_3$(ZnO)$_m$ (m>0) may be used as the oxide semiconductor film. Here, M represents one or more metal elements selected from Ga, Al, Mn, and Co. For example, M may be Ga, Ga and Al, Ga and Mn, Ga and Co, or the like.

An oxide semiconductor film is in a single crystal state, a polycrystalline (also referred to as polycrystal) state, an amorphous state, or the like.

An oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The gate insulating film 112 and the protective insulating film 118 may each be formed to have a stacked-layer structure or a single-layer structure using, for example, one or more of silicon oxide, silicon oxynitride, silicon nitride oxide, silicon nitride, aluminum oxide, hafnium oxide, yttrium oxide, zirconium oxide, and the like. For example, the gate insulating film 112 and the protective insulating film 118 may be formed by a thermal oxidation method, a plasma CVD method, a sputtering method, or the like. In the case where an oxide semiconductor film is used for the semiconductor film 106, a film from which oxygen is released by heat treatment is preferably used for the gate insulating film 112 and the protective insulating film 118. With the use of such a film from which oxygen is released by heat treatment, defects generated in the semiconductor film 106 can be repaired and deterioration in electric characteristics of the transistor can be suppressed.

To release oxygen by heat treatment means that the released amount of oxygen which is converted into oxygen atoms is greater than or equal to $1.0 \times 10^{18}$ atoms/cm³ or greater than or equal to $3.0 \times 10^{20}$ atoms/cm³ in thermal desorption spectroscopy (TDS) analysis.

Here, a method in which the amount of released oxygen is measured using TDS analysis will be described below.

The amount of released gas in TDS analysis is proportional to the integral value of ion intensity in a predetermined temperature range. Therefore, the amount of released gas can be calculated from the ratio between the integral value of measured ion intensity and the reference value of a standard sample. The reference value of a standard sample refers to the ratio of the density of a predetermined atom contained in a sample to the integral value of ion intensity corresponding to the predetermined atom.

For example, the amount of the released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all gases having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2} = N_{H2}/S_{H2} \times S_{O2} \times \alpha \qquad \text{(Equation 1)}$$

$N_{H2}$ is the value obtained by conversion of the amount of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Japanese Published Patent Application No. H6-275697 is to be referred to for details of Equation 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm³ as the standard sample.

Further, in the TDS analysis, oxygen is partly detected as an oxygen atom. The ratio between oxygen molecules and oxygen atoms can be calculated from the ionization rate of the oxygen molecules. Note that since the above $\alpha$ includes the ionization rate of the oxygen molecules, the amount of the released oxygen atoms can be estimated through the evaluation of the amount of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide ($SiO_X$(X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the gate insulating film 112 or the protective insulating film 118 to the semiconductor film 106 which is an oxide semiconductor film, the interface state density at the interface between the semiconductor film 106 and the gate insulating film 112 or the interface state density at the interface between the semiconductor film 106 and the protective insulating film 118 can be decreased. As a result, carrier trapping due to an operation of the transistor or the like at the interface between the semiconductor film 106 and the gate insulating film 112 or the interface between the semiconductor film 106 and the protective insulating film 118 can be suppressed; thus, a transistor with less deterioration in electric characteristics can be obtained.

Further, electric charge is generated owing to oxygen deficiency in the oxide semiconductor film in some cases. In general, part of oxygen deficiency in an oxide semiconductor film serves as a donor and causes release of an electron which is a carrier. As a result, the threshold voltage of a transistor shifts in the negative direction. When oxygen is sufficiently supplied from the gate insulating film 112 or the protective insulating film 118 to the semiconductor film 106, oxygen deficiency in the oxide semiconductor film which causes the shift of the threshold voltage of the transistor in the negative direction can be reduced.

The pair of electrodes 116 may be formed with a single-layer structure or a stacked-layer structure using a metal film, a metal nitride film, a metal oxide film, an alloy film, or the like given for the first gate electrode 104 and the second gate electrode 105.

As described above, the first gate electrode 104 and the second gate electrode 105 which are different in shape are provided, and the semiconductor film 106 at least partly overlapped with the first gate electrode 104 and the second gate electrode 105 is formed, whereby a channel length L' can be made three times or more, preferably five times or more, further preferably ten times or more as long as an apparent channel length L. Note that the apparent channel length L is a distance between the pair of electrodes 116 when seen in the top view. Therefore, even when the size of a transistor is reduced, the adverse effect of a short-channel effect can be reduced, and an integration degree of a semiconductor device can be increased. In addition, a semiconductor device with lower power consumption and higher yield can be provided.

An example of a method for manufacturing the transistor described in this embodiment will be shown.

First, the first gate electrode 104 is formed over the substrate 100; the second gate electrode 105 whose top surface is smaller than that of the first gate electrode 104 is formed over the first gate electrode 104; the gate insulating film 112 covering the first gate electrode 104 and the second gate electrode 105 is formed; the semiconductor film 106 which is over the gate insulating film 112 and at least partly overlapped with the second gate electrode 105 is formed; the pair of electrodes 116 which is over the semiconductor film 106 and partly in contact with the semiconductor film 106 is formed; and then the protective insulating film 118 covering the gate insulating film 112, the semiconductor film 106, and the pair of electrodes 116 is formed.

For example, as for the first gate electrode 104 and the second gate electrode 105, first, a first conductive film to be the first gate electrode 104 and a second conductive film to be the second gate electrode 105 are deposited in this order, and a resist mask is formed over the second conductive film. Then, the first conductive film and the second conductive film are etched so that the top surfaces thereof have the same shapes. Then, the second conductive film is etched under a condition in which the etching rate of the second conductive film is higher than that of the first conductive film. Accordingly, the second conductive film is made thinner, and the second gate electrode 105 whose top surface is smaller than that of the first gate electrode 104 can be formed.

Note that plasma treatment such as reverse sputtering treatment may be performed on the first gate electrode 104 and the second gate electrode 105. Through such treatment, the angular corners of the upper end portions of the first gate electrode 104 and the second gate electrode 105 can be curved; therefore, the gate insulating film 112 and the semiconductor film 106 which will be formed later can have better coverage with the first gate electrode 104 and the second gate electrode 105.

This embodiment can be implemented in appropriate combination with the other embodiments.

Embodiment 2

In this embodiment, a transistor having a structure different from that of the transistor described in Embodiment 1 will be described with reference to FIGS. 2A to 2C.

Figure 2A:
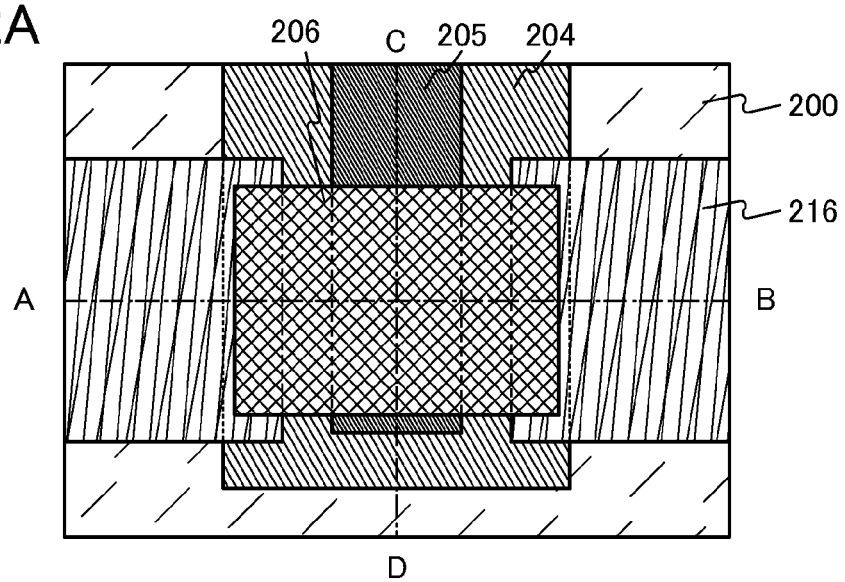
FIGS. 2A to 2C are a top view and cross-sectional views illustrating an example of a semiconductor device which is one embodiment of the present invention.
Figure 2B:
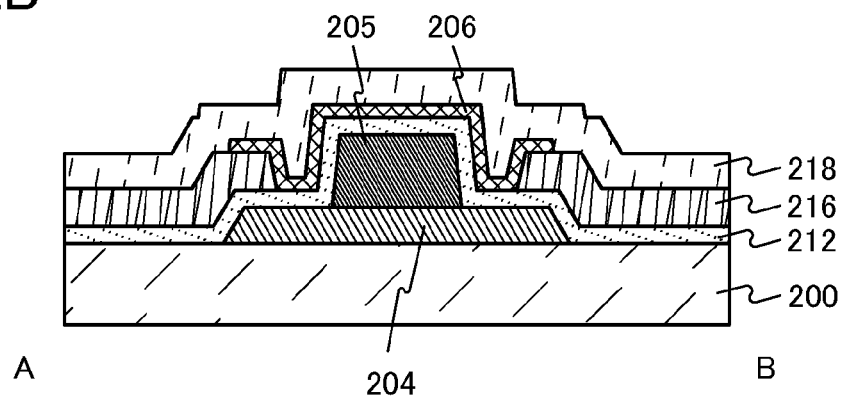
Figure 2C:
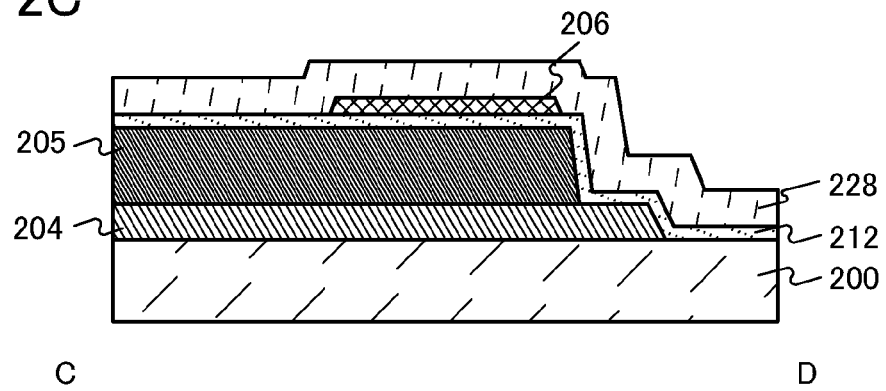

FIGS. 2A to 2C are a top view and cross-sectional views of a transistor which is one embodiment of the present invention. A cross section along the dashed-dotted line A-B in FIG. 2A and a cross section along the dashed-dotted line C-D in FIG. 2A correspond to a cross section A-B in FIG. 2B and a cross section C-D in FIG. 2C, respectively. Note that a protective insulating film 218 and a gate insulating film 212 are not illustrated in FIG. 2A for simplicity.

Here, the cross section A-B in FIG. 2B will be described in detail.

The cross-section A-B is a cross section of a transistor including a substrate 200; a first gate electrode 204 over the substrate 200; a second gate electrode 205 which is over the first gate electrode 204 and whose top surface is smaller than that of the first gate electrode 204; the gate insulating film 212 covering the first gate electrode 204 and the second gate electrode 205; a pair of electrodes 216 over the gate insulating film 212; a semiconductor film 206 which is over the gate insulating film 212, partly in contact with the pair of electrodes 216, and at least partly overlapped with the second gate electrode 205; and the protective insulating film 218 covering the gate insulating film 212, the semiconductor film 206, and the pair of electrodes 216. Note that a base insulating film may be formed over the substrate.

The widths and heights of the first gate electrode 204 and the second gate electrode 205 are selected as follows. Specifically, the widths and heights can be selected by forming a three-dimensional channel region with the use of the first gate electrode 204 and the second gate electrode 205 so that a channel length L' is made three times or more, preferably five times or more, further preferably ten times or more as long as an apparent channel length L. Note that the apparent channel length L is a distance between the pair of electrodes 216. In order to satisfy the above range, in the cross-sectional shape of the second gate electrode 205, the sum of the lengths of sides of the side surfaces may be made twice or more as long as the length of a side of the top surface.

Note that the substrate 100, the first gate electrode 104, the second gate electrode 105, the gate insulating film 112, the pair of electrodes 116, and the protective insulating film 118 described in Embodiment 1 are referred to for the substrate 200, the first gate electrode 204, the second gate electrode 205, the gate insulating film 212, the pair of electrodes 216, and the protective insulating film 218, respectively.

By forming a three-dimensional channel region with the use of the first gate electrode 204 and the second gate electrode 205, a channel length L' can be made three times or more, preferably five times or more, further preferably ten times or more as long as an apparent channel length L. Note that the apparent channel length L is a distance between the pair of electrodes 216. Therefore, even when the size of a transistor is reduced, the adverse effect of a short-channel effect can be reduced, and an integration degree of a semiconductor device can be increased. In addition, a semiconductor device with lower power consumption and higher yield can be provided.

An example of a method for manufacturing the transistor described in this embodiment will be shown.

First, the first gate electrode 204 is formed over the substrate 200; the second gate electrode 205 whose top surface is smaller than that of the first gate electrode 204 is formed over the first gate electrode 204; the gate insulating film 212 covering the first gate electrode 204 and the second gate electrode 205 is formed; the pair of electrodes 216 is formed over the gate insulating film 212; the semiconductor film 206 which is over the gate insulating film 212, partly in contact with the pair of electrodes 216, and at least partly overlapped with the second gate electrode 205 is formed; and then the protective insulating film 218 covering the gate insulating film 212, the semiconductor film 206, and the pair of electrodes 216 is formed.

Note that plasma treatment such as reverse sputtering treatment may be performed on the pair of electrodes 216, the first gate electrode 204, and the second gate electrode 205 so that the angular corners of the upper end portions of the pair of electrodes 216, the first gate electrode 204, and the second gate electrode 205 are curved.

This embodiment can be implemented in appropriate combination with the other embodiments.

Embodiment 3

In this embodiment, a transistor having a structure different from that of the transistors described in Embodiment 1 and Embodiment 2 will be described with reference to FIGS. 3A to 3C.

Figure 3A:
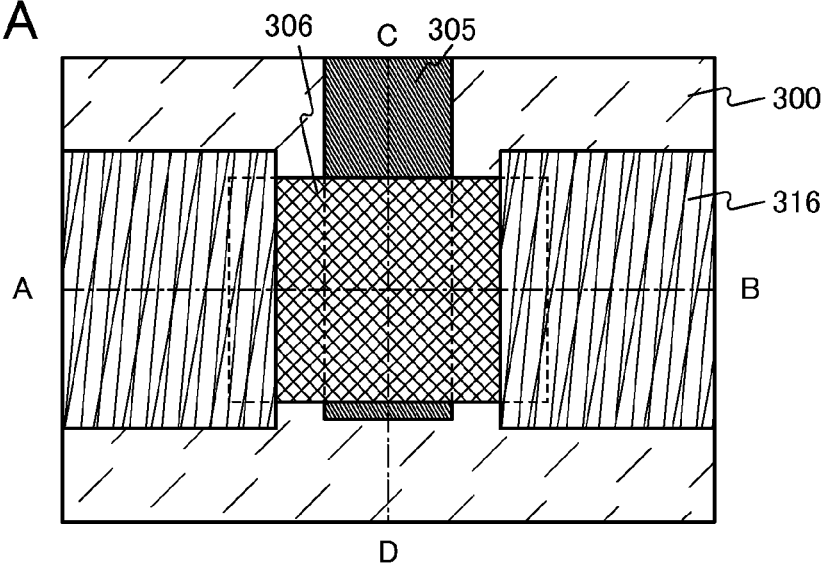
FIGS. 3A to 3C are a top view and cross-sectional views illustrating an example of a semiconductor device which is one embodiment of the present invention.
Figure 3B:
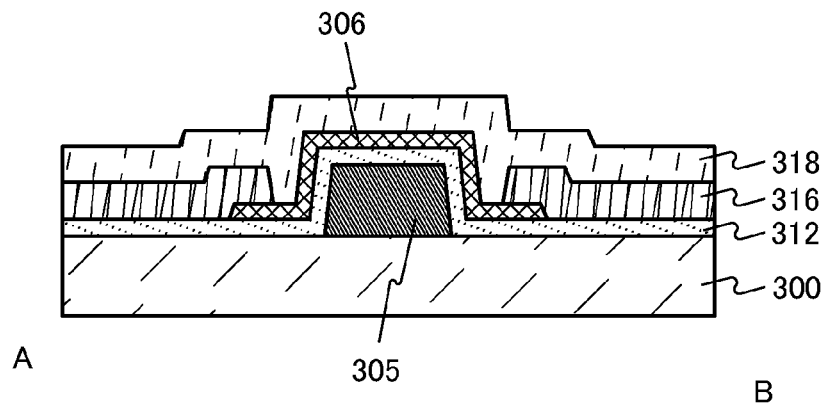
Figure 3C:
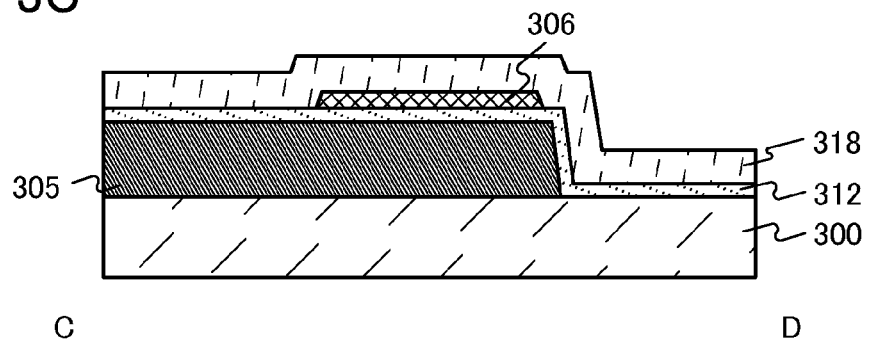

FIGS. 3A to 3C are a top view and cross-sectional views of a transistor which is one embodiment of the present invention. A cross section along the dashed-dotted line A-B in FIG. 3A and a cross section along the dashed-dotted line C-D in FIG. 3A correspond to a cross section A-B in FIG. 3B and a cross section C-D in FIG. 3C, respectively. Note that a protective insulating film 318 and a gate insulating film 312 are not illustrated in FIG. 3A for simplicity.

Here, the cross section A-B in FIG. 3B will be described in detail.

The cross-section A-B is a cross section of a transistor including a substrate 300; a gate electrode 305 over the substrate 300; the gate insulating film 312 covering the gate electrode 305; a semiconductor film 306 which is over the gate insulating film 312 and at least partly overlapped with the gate electrode 305; a pair of electrodes 316 which is over the semiconductor film 306 and partly in contact with the semiconductor film 306; and the protective insulating film 318 covering the gate insulating film 312, the semiconductor film 306, and the pair of electrodes 316. Note that a base insulating film may be formed over the substrate.

The width and height of the gate electrode 305 are selected as follows. Specifically, the width and height can be selected by forming a three-dimensional channel region with the use of the gate electrode 305 so that a channel length L' is made three times or more, preferably five times or more, further preferably ten times or more as long as an apparent channel length L. Note that the apparent channel length L is a distance between the pair of electrodes 316. In order to satisfy the above range, in the cross-sectional shape of the gate electrode 305, the sum of the lengths of sides of the side surfaces may be made twice or more as long as the length of a side of the top surface.

Note that the substrate 100, the second gate electrode 105, the gate insulating film 112, the pair of electrodes 116, and the protective insulating film 118 described in Embodiment 1 are referred to for the substrate 300, the gate electrode 305, the gate insulating film 312, the pair of electrodes 316, and the protective insulating film 318, respectively.

Here, in the case of providing a base insulating film over the substrate, an insulating film which releases an impurity that generates a carrier in the semiconductor film 306, such as hydrogen, nitrogen, boron, or phosphorus, is preferably provided. With such a structure, an impurity is released from the base insulating film by, for example, heat treatment, so that a lightly doped drain (LDD) region can be provided in a region of the semiconductor film 306 which does not overlap with the gate electrode 305. By providing the LDD region, degradation of a transistor, such as hot-carrier degradation, can be suppressed, and a highly reliable transistor can be manufactured.

Alternatively, treatment for reducing resistance, such as plasma treatment, ion doping treatment, or ion implantation treatment may be performed on a region of the semiconductor film 306, which is not overlapped with the gate electrode 305. An LDD region can be provided in the semiconductor film 306 by the treatment for reducing resistance.

By forming a three-dimensional channel region with the use of the gate electrode 305, a channel length L' can be made three times or more, preferably five times or more, further preferably ten times or more as long as an apparent channel length L. Note that the apparent channel length L is a distance between the pair of electrodes 316. Therefore, even when the size of a transistor is reduced, the adverse effect of a short-channel effect can be reduced, and an integration degree of a semiconductor device can be increased. In addition, a semiconductor device with lower power consumption and higher yield can be provided.

An example of a method for manufacturing the transistor described in this embodiment will be shown.

First, the gate electrode 305 is formed over the substrate 300; the gate insulating film 312 covering the gate electrode 305 is formed; the semiconductor film 306 which is over the gate insulating film 312 and at least partly overlapped with the gate electrode 305 is formed; the pair of electrodes 316 which is over the semiconductor film 306 and partly in contact with the semiconductor film 306 is formed; and then the protective insulating film 318 covering the gate insulating film 312, the semiconductor film 306, and the pair of electrodes 316 is formed.

Note that plasma treatment such as reverse sputtering treatment may be performed on the gate electrode 305 so that the angular corners of the upper end portions of the gate electrode 305 are curved.

This embodiment can be implemented in appropriate combination with the other embodiments.

Embodiment 4

In this embodiment, a transistor having a structure different from that of the transistors described in Embodiments 1 to 3 will be described with reference to FIGS. 4A to 4C.

Figure 4A:
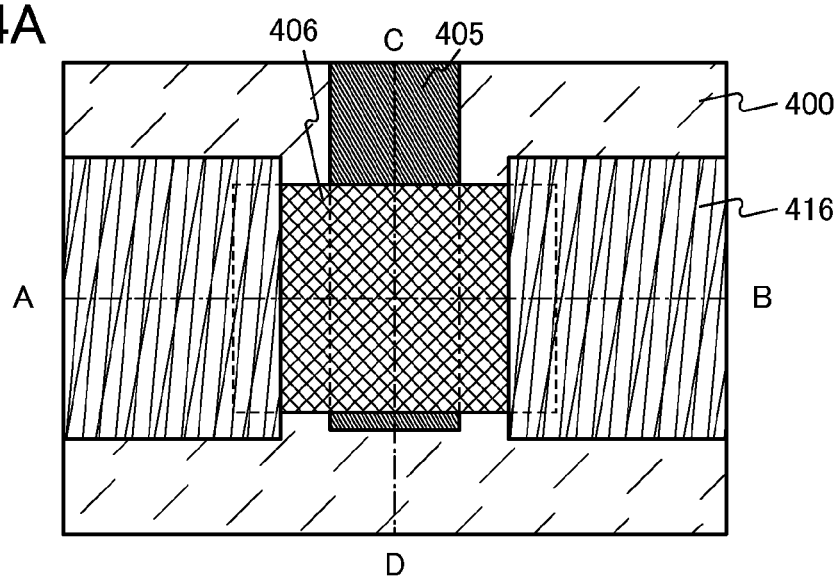
FIGS. 4A to 4C are a top view and cross-sectional views illustrating an example of a semiconductor device which is one embodiment of the present invention.
Figure 4B:
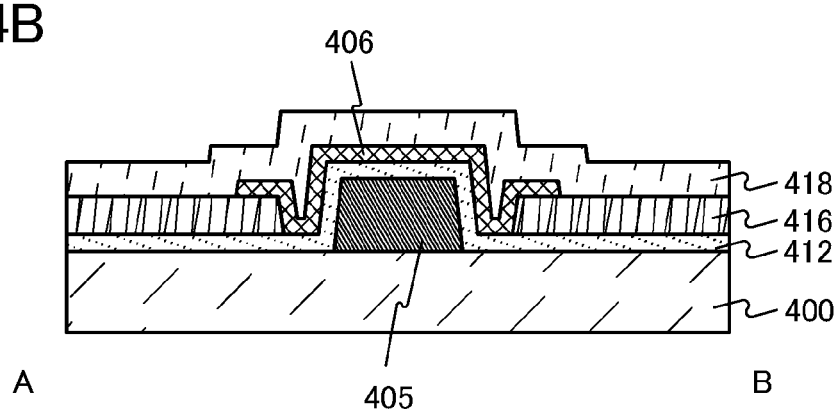
Figure 4C:
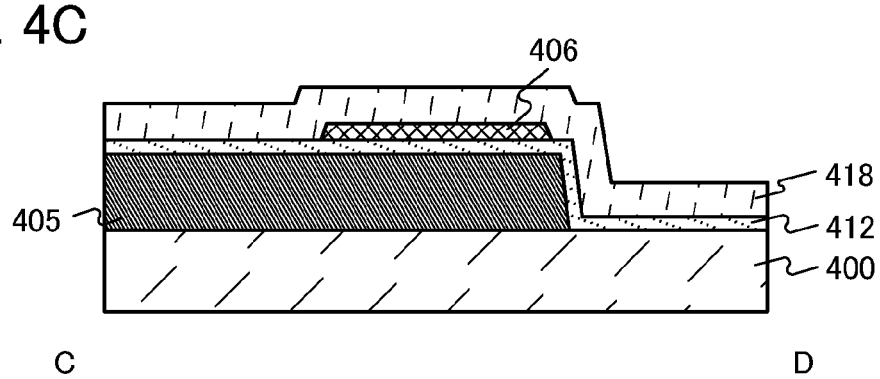

FIGS. 4A to 4C are a top view and cross-sectional views of a transistor which is one embodiment of the present invention. A cross section along the dashed-dotted line A-B in FIG. 4A and a cross section along the dashed-dotted line C-D in FIG. 4A correspond to a cross section A-B in FIG. 4B and a cross section C-D in FIG. 4C, respectively. Note that a protective insulating film 418 and a gate insulating film 412 are not illustrated in FIG. 4A for simplicity.

Here, the cross section A-B in FIG. 4B will be described in detail.

The cross-section A-B is a cross section of a transistor including a substrate 400; a gate electrode 405 over the substrate 400; the gate insulating film 412 covering the gate electrode 405; a pair of electrodes 416 over the gate insulating film 412; a semiconductor film 406 which is over the gate insulating film 412, partly in contact with the pair of electrodes 416, and at least partly overlapped with the gate electrode 405; and the protective insulating film 418 covering the gate insulating film 412, the semiconductor film 406, and the pair of electrodes 416. Note that a base insulating film may be formed over the substrate.

The width and height of the gate electrode 405 are selected as follows. Specifically, the width and height can be selected by forming a three-dimensional channel region with the use of the gate electrode 405 so that a channel length L' is made three times or more, preferably five times or more, further preferably ten times or more as long as an apparent channel length L. Note that the apparent channel length L is a distance between the pair of electrodes 416. In order to satisfy the above range, in the cross-sectional shape of the gate electrode 405, the sum of the lengths of sides of the side surfaces may be made twice or more as long as the length of a side of the top surface.

Note that the substrate 100, the second gate electrode 105, the gate insulating film 112, the pair of electrodes 116, and the protective insulating film 118 described in Embodiment 1 are referred to for the substrate 400, the gate electrode 405, the gate insulating film 412, the pair of electrodes 416, and the protective insulating film 418, respectively.

Here, in the case of providing a base insulating film over the substrate, an insulating film which releases an impurity that generates a carrier in the semiconductor film 406, such as hydrogen, nitrogen, boron, or phosphorus, is preferably provided. With such a structure, an impurity is released from the base insulating film by, for example, heat treatment, so that an LDD region can be provided in a region of the oxide semiconductor film 406 which does not overlap with the gate electrode 405. By providing the LDD region, degradation of a transistor, such as hot-carrier degradation, can be suppressed, and a highly reliable transistor can be manufactured.

Alternatively, treatment for reducing resistance, such as plasma treatment, ion doping treatment, or ion implantation treatment may be performed on a region of the semiconductor film 406, which is not overlapped with the gate electrode 405. An LDD region can be provided in the semiconductor film 406 by the treatment for reducing resistance.

By forming a three-dimensional channel region with the use of the gate electrode 405, a channel length L' can be made three times or more, preferably five times or more, further preferably ten times or more as long as an apparent channel length L. Note that the apparent channel length L is a distance between the pair of electrodes 416. Therefore, even when the size of a transistor is reduced, the adverse effect of a short-channel effect can be reduced, and an integration degree of a semiconductor device can be increased. In addition, a semiconductor device with lower power consumption and higher yield can be provided.

An example of a method for manufacturing the transistor described in this embodiment will be shown.

First, the gate electrode 405 is formed over the substrate 400; the gate insulating film 412 covering the gate electrode 405 is formed; the pair of electrodes 416 is formed over the gate insulating film 412; the semiconductor film 406 which is over the gate insulating film 412, partly in contact with the pair of electrodes 416, and at least partly overlapped with the gate electrode 405 is formed; and then the protective insulating film 418 covering the gate insulating film 412, the semiconductor film 406, and the pair of electrodes 416 is formed.

Note that plasma treatment such as reverse sputtering treatment may be performed on the pair of electrodes 416 and the gate electrode 405 so that the angular corners of the upper end portions of the pair of electrodes 416 and the gate electrode 405 are curved.

This embodiment can be implemented in appropriate combination with the other embodiments.

Embodiment 5

In this embodiment, a transistor having a structure different from that of the transistors described in Embodiments 1 to 4 will be described with reference to FIGS. 5A to 5C.

Figure 5A:
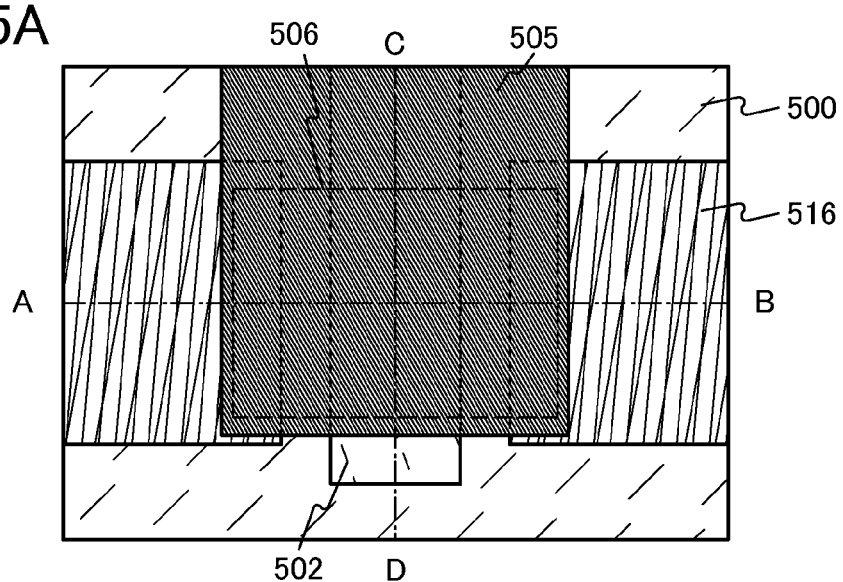
FIGS. 5A to 5C are a top view and cross-sectional views illustrating an example of a semiconductor device which is one embodiment of the present invention.
Figure 5B:
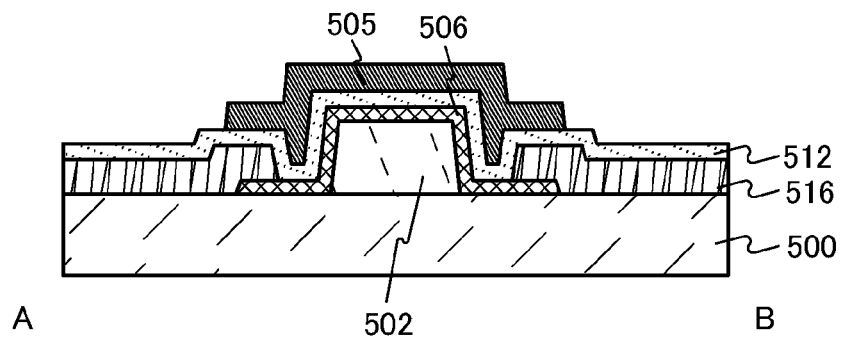
Figure 5C:
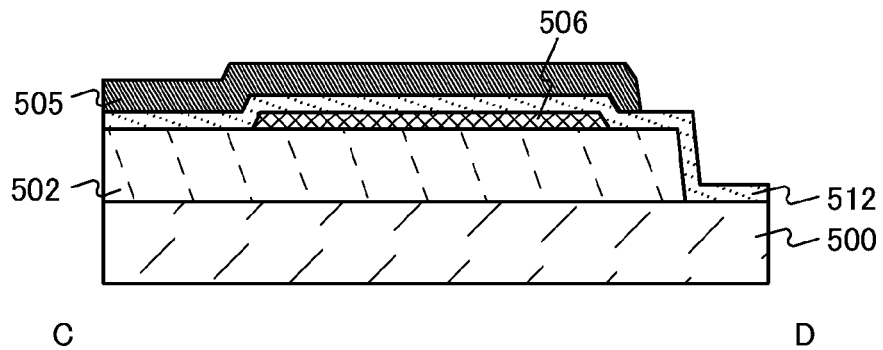

FIGS. 5A to 5C are a top view and cross-sectional views of a transistor which is one embodiment of the present invention. A cross section along the dashed-dotted line A-B in FIG. 5A and a cross section along the dashed-dotted line C-D in FIG. 5A correspond to a cross section A-B in FIG. 5B and a cross section C-D in FIG. 5C, respectively. Note that a gate insulating film 512 is not illustrated in FIG. 5A for simplicity.

Here, the cross section A-B in FIG. 5B will be described in detail.

The cross-section A-B is a cross section of a transistor including a substrate 500; a structure 502 over the substrate 500; a semiconductor film 506 at least partly overlapped with the structure 502; a pair of electrodes 516 which is over the semiconductor film 506 and partly in contact with the semiconductor film 506; a gate insulating film 512 covering the semiconductor film 506; and a gate electrode 505 overlapped with the semiconductor film 506 with the gate insulating film 512 provided therebetween. Note that a base insulating film may be formed over the substrate.

The width and height of the structure 502 are selected as follows. Specifically, the width and height can be selected by forming a three-dimensional channel region with the use of the structure 502 so that a channel length L' is made three times or more, preferably five times or more, further preferably ten times or more as long as an apparent channel length L. Note that the apparent channel length L is a distance between the pair of electrodes 516. In order to satisfy the above range, in the cross-sectional shape of the structure 502, the sum of the lengths of sides of the side surfaces may be made twice or more as long as the length of a side of the top surface.

Although FIGS. 5A to 5C illustrate in a manner such that the gate electrode 505 and the pair of electrodes 516 are overlapped with each other, one embodiment of the present invention is not limited thereto. For example, the gate electrode 505 and the pair of electrodes 516 are not necessarily overlapped with each other. In that case, an LDD region may be provided by performing treatment for reducing resistance on a region of the semiconductor film 506 which does not overlap with the gate electrode 505. By providing the LDD region, degradation of a transistor, such as hot-carrier degradation, can be suppressed, and a highly reliable transistor can be manufactured. Further, the parasitic capacitance generated between the pair of electrodes 516 and the gate electrode 505 can be made small, so that the transistor can operate at high speed.

Any material can be used for the structure 502 as long as it has heat resistance enough to withstand heat treatment performed later. For example, an inorganic compound such as silicon oxide, silicon oxynitride, silicon nitride oxide, silicon nitride, aluminum oxide, aluminum oxynitride, aluminum nitride oxide, or aluminum nitride; or an organic compound such as polyimide can be used.

In the case where an oxide semiconductor film is used for the semiconductor film 506, a film from which oxygen is released by heat treatment is preferably used for the structure 502. In addition, as a base insulating film, a film from which oxygen is released by heat treatment may be provided over the substrate 500. When films from which oxygen is released by heat treatment are provided as the structure 502 and the base insulating film, the interface state density at the interface between the semiconductor film 506 and the structure 502 or the interface state density at the interface between the semiconductor film 506 and the base insulating film, and the oxygen deficiency of the semiconductor film 506 which is an oxide semiconductor film can be reduced; and the adverse effect of carrier trapping at the interface between the semiconductor film 506 which is an oxide semiconductor film, and the structure 502 or the base insulating film can be reduced.

Further, in the case of providing the base insulating film over the substrate, an insulating film which releases an impurity that generates a carrier in the semiconductor film 506, such as hydrogen, nitrogen, boron, or phosphorus, is preferably provided. With such a structure, an impurity is released from the base insulating film by, for example, heat treatment, so that an LDD region can be provided in a region of the semiconductor film 506 which does not overlap with the structure 502. By providing the LDD region, degradation of a transistor, such as hot-carrier degradation, can be suppressed, and a highly reliable transistor can be manufactured. Alternatively, the structure 502 may have a stacked-layer structure with a film that hardly transmits hydrogen, nitrogen, boron, phosphorus, or the like on the side in contact with the base insulating film and a film from which oxygen is released by heat treatment on the gate insulating film 512 side. When the film from which oxygen is released by heat treatment is provided for the structure 502, oxygen deficiency can be reduced in a channel region to be formed, and the interface state density at the interface between the structure 502 and the semiconductor film 506 can be reduced. Accordingly, it is possible to improve reliability and electric characteristics of the transistor.

Alternatively, treatment for reducing resistance, such as plasma treatment, ion doping treatment, or ion implantation treatment may be performed on a region of the semiconductor film 506, which is not overlapped with the structure 502. An LDD region can be provided in the semiconductor film 506 by the treatment for reducing resistance.

Note that the substrate 100, the second gate electrode 105, the gate insulating film 112, and the pair of electrodes 116 described in Embodiment 1 are referred to for the substrate 500, the gate electrode 505, the gate insulating film 512, and the pair of electrodes 516, respectively.

By forming a three-dimensional channel region with the use of the structure 502, a channel length L' can be made three times or more, preferably five times or more, further preferably ten times or more as long as an apparent channel length L. Note that the apparent channel length L is a distance between the pair of electrodes 516. Therefore, even when the size of a transistor is reduced, the adverse effect of a short-channel effect can be reduced, and an integration degree of a semiconductor device can be increased. In addition, a semiconductor device with lower power consumption and higher yield can be provided.

An example of a method for manufacturing the transistor described in this embodiment will be shown.

First, the structure 502 is formed over the substrate 500; the semiconductor film 506 at least partly overlapped with the structure 502 is formed; the pair of electrodes 516 which is over the semiconductor film 506 and partly in contact with the semiconductor film 506 is formed; the gate insulating film 512 covering the semiconductor film 506 is formed; and then the gate electrode 505 overlapped with the semiconductor film 506 with the gate insulating film 512 provided therebetween is formed.

Note that plasma treatment such as reverse sputtering treatment may be performed on the pair of electrodes 516 and the structure 502 so that the angular corners of the upper end portions of the pair of electrodes 516 and the structure 502 are curved.

This embodiment can be implemented in appropriate combination with the other embodiments.

Embodiment 6

In this embodiment, a transistor having a structure different from that of the transistors described in Embodiments 1 to 5 will be described with reference to FIGS. 6A to 6C.

Figure 6A:
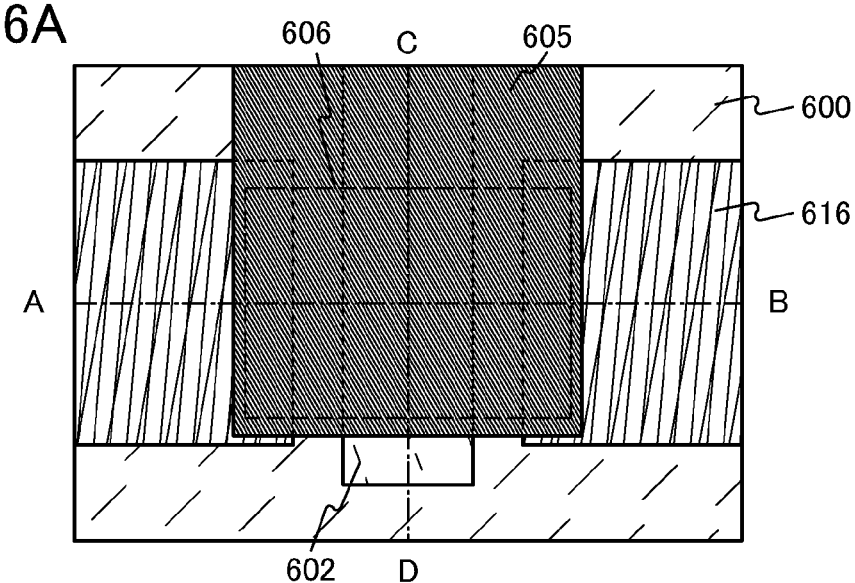
FIGS. 6A to 6C are a top view and cross-sectional views illustrating an example of a semiconductor device which is one embodiment of the present invention.
Figure 6B:
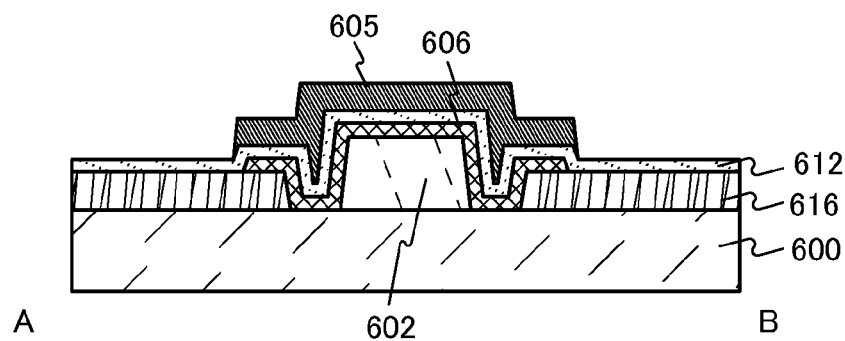
Figure 6C:
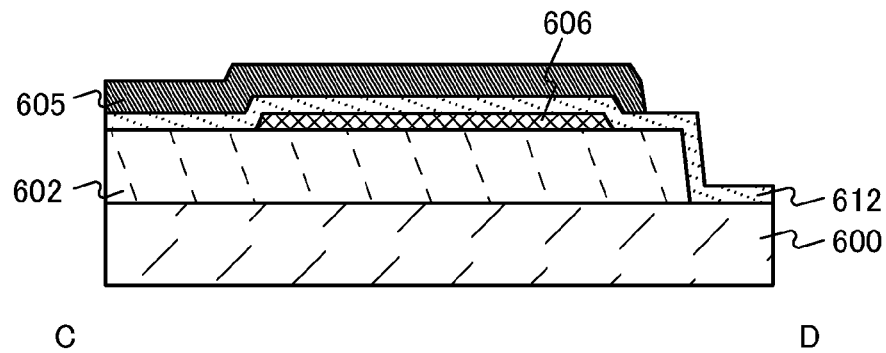

FIGS. 6A to 6C are a top view and cross-sectional views of a transistor which is one embodiment of the present invention. A cross section along the dashed-dotted line A-B in FIG. 6A and a cross section along the dashed-dotted line C-D in FIG. 6A correspond to a cross section A-B in FIG. 6B and a cross section C-D in FIG. 6C, respectively.

Here, the cross section A-B in FIG. 6B will be described in detail.

The cross-section A-B is a cross section of a transistor including a substrate 600; a structure 602 over the substrate 600; a semiconductor film 606 at least partly overlapped with the structure 602; a pair of electrodes 616 which is below the semiconductor film 606 and partly in contact with the semiconductor film 606; a gate insulating film 612 covering the semiconductor film 606; and a gate electrode 605 overlapped with the semiconductor film 606 with the gate insulating film 612 provided therebetween. Note that a base insulating film may be formed over the substrate.

The width and height of the structure 602 are selected as follows. Specifically, the width and height can be selected by forming a three-dimensional channel region with the use of the structure 602 so that a channel length L' is made three times or more, preferably five times or more, further preferably ten times or more as long as an apparent channel length L. Note that the apparent channel length L is a distance between the pair of electrodes 616. In order to satisfy the above range, in the cross-sectional shape of the structure 602, the sum of the lengths of sides of the side surfaces may be made twice or more as long as the length of a side of the top surface.

Although FIGS. 6A to 6C illustrate in a manner such that the gate electrode 605 and the pair of electrodes 616 are overlapped with each other, one embodiment of the present invention is not limited thereto. For example, the gate electrode 605 and the pair of electrodes 616 are not necessarily overlapped with each other. In that case, an LDD region may be provided by performing treatment for reducing resistance on a region of the semiconductor film 606 which is not overlapped with the gate electrode 605. By providing the LDD region, degradation of a transistor, such as hot-carrier degradation, can be suppressed, and a highly reliable transistor can be manufactured. Further, the parasitic capacitance generated between the pair of electrodes 616 and the gate electrode 605 can be made small, so that the transistor can operate at high speed.

The structure 602 may be formed using a material similar to that of the structure 502 described in Embodiment 5.

In the case where an oxide semiconductor film is used for the semiconductor film 606, a film from which oxygen is released by heat treatment is preferably used for the structure 602. In addition, as a base insulating film, a film from which oxygen is released by heat treatment may be provided over the substrate 600.

Further, in the case of providing the base insulating film over the substrate, an insulating film which releases an impurity that generates a carrier in the semiconductor film 606, such as hydrogen, nitrogen, boron, or phosphorus, is preferably provided. With such a structure, an impurity is released from the base insulating film by, for example, heat treatment, so that an LDD region can be provided in a region of the semiconductor film 606 which does not overlap with the structure 602. By providing the LDD region, degradation of a transistor, such as hot-carrier degradation, can be suppressed, and a highly reliable transistor can be manufactured. Alternatively, the structure 602 may have a stacked-layer structure with a film that hardly transmits hydrogen, nitrogen, boron, phosphorus, or the like on the side in contact with the base insulating film and a film from which oxygen is released by heat treatment on the gate insulating film 612 side. When the film from which oxygen is released by heat treatment is provided for the structure 602, oxygen deficiency can be reduced in a channel region to be formed, and the interface state density at the interface between the structure 602 and the semiconductor film 606 can be reduced. Accordingly, it is possible to improve reliability and electric characteristics of the transistor.

Alternatively, treatment for reducing resistance, such as plasma treatment, ion doping treatment, or ion implantation treatment may be performed on a region of the semiconductor film 606, which is not overlapped with the structure 602. An LDD region can be provided in the semiconductor film 606 by the treatment for reducing resistance.

Note that the substrate 100, the second gate electrode 105, the gate insulating film 112, and the pair of electrodes 116 described in Embodiment 1 are referred to for the substrate 600, the gate electrode 605, the gate insulating film 612, and the pair of electrodes 616, respectively.

By forming a three-dimensional channel region with the use of the structure 602, a channel length L' can be made three times or more, preferably five times or more, further preferably ten times or more as long as an apparent channel length L. Note that the apparent channel length L is a distance between the pair of electrodes 616. Therefore, even when the size of a transistor is reduced, the adverse effect of a short-channel effect is reduced, and an integration degree of a semiconductor device can be increased. In addition, a semiconductor device with lower power consumption and higher yield can be provided.

An example of a method for manufacturing the transistor described in this embodiment will be shown.

First, the structure 602 is formed over the substrate 600; the semiconductor film 606 at least partly overlapped with the structure 602 is formed; the pair of electrodes 616 which is below the semiconductor film 606 and partly in contact with the semiconductor film 606 is formed; the gate insulating film 612 covering the semiconductor film 606 is formed; and then the gate electrode 605 overlapped with the semiconductor film 606 with the gate insulating film 612 provided therebetween is formed.

Note that plasma treatment such as reverse sputtering treatment may be performed on the pair of electrodes 616 and the structure 602 so that the angular corners of the upper end portions of the pair of electrodes 616 and the structure 602 are curved.

This embodiment can be implemented in appropriate combination with the other embodiments.

Embodiment 7

In this embodiment, the cross-sectional shape of a gate electrode or a structure which can be applied to the transistor described in any of Embodiments 1 to 6 will be described with reference to FIGS. 7A to 7C.

Figure 7A:
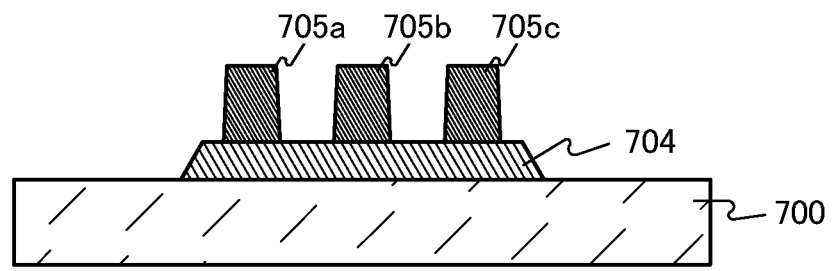
FIGS. 7A to 7C are cross-sectional views each illustrating an example of a semiconductor device which is one embodiment of the present invention.

FIG. 7A is a cross-sectional shape illustrating a first gate electrode 704, a second gate electrode 705a, a second gate electrode 705b, and a second gate electrode 705c provided over a substrate 700 in order to make a channel length L' much longer than an apparent channel length L which is a distance between the pair of electrodes when seen in the top views in Embodiment 1 and Embodiment 2. Here, the substrates 100 and 200, the first gate electrodes 104 and 204, and the second gate electrodes 105 and 205 described in Embodiment 1 and Embodiment 2 are referred to for the substrate 700, the first gate electrode 704, and the second gate electrodes 705a, 705b, and 705c, respectively.

A channel length L' of a semiconductor film which will be formed later can be made much longer than that of the transistor described in Embodiment 1 or Embodiment 2 by providing the second gate electrodes 705a, 705b, and 705c. In addition, each of the second gate electrodes can be reduced in thickness; therefore, a gate insulating film, a semiconductor film, and the like which will be formed later can have better coverage with the second gate electrodes. Note that the second gate electrodes are not limited to the second gate electrodes 705a, 705b, and 705c. For example, only the second gate electrodes 705a and 705b may be provided, or four or more second gate electrodes may be provided.

Figure 7B:
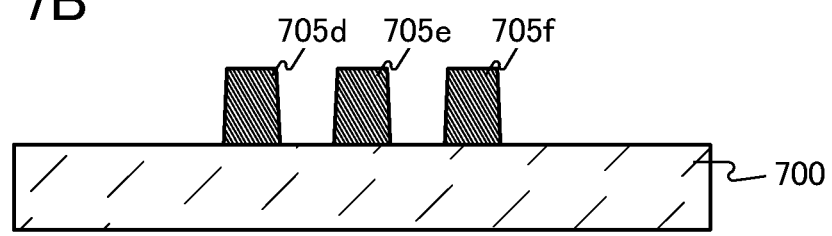

FIG. 7B is a cross-sectional shape illustrating a gate electrode 705d, a gate electrode 705e, and a gate electrode 705f provided over the substrate 700 in order to make a channel length L' much longer than an apparent channel length L which is a distance between the pair of electrodes when seen in the top views in Embodiment 3 and Embodiment 4. In addition, each of the gate electrodes can be reduced in thickness; therefore, a gate insulating film, a semiconductor film, and the like which will be formed later can have better coverage with the gate electrodes. Although not illustrated, the gate electrodes 705d, 705e, and 705f are electrically connected to each other. Here, the gate electrode 305 and the gate electrode 405 described in Embodiment 3 and Embodiment 4, respectively, are referred to for the gate electrodes 705d, 705e, and 705f.

A channel length L' of a semiconductor film which will be formed later can be made much longer than that of the transistor described in Embodiment 3 or Embodiment 4 by providing the gate electrodes 705d, 705e, and 705f. Note that the gate electrodes are not limited to the gate electrodes 705d, 705e, and 705f. For example, only the gate electrodes 705d and 705e may be provided, or four or more gate electrodes may be provided.

Figure 7C:
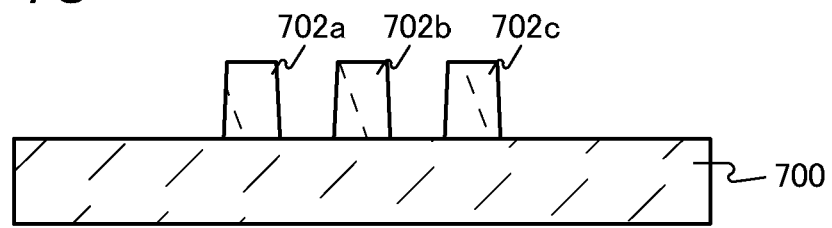

FIG. 7C is a cross-sectional shape illustrating a structure 702a, a structure 702b, and a structure 702c provided over the substrate 700 in order to make a channel length L' much longer than an apparent channel length L which is a distance between the pair of electrodes when seen in the top views in Embodiment 5 and Embodiment 6. In addition, each of the structures can be reduced in thickness; therefore, a gate insulating film, a semiconductor film, and the like which will be formed later can have better coverage with the structures. Here, the structure 502 and the structure 602 described in Embodiment 5 and Embodiment 6, respectively, are referred to for the structures 702a, 702b, and 702c.

A channel length L' of a semiconductor film which will be formed later can be made much longer than that of the transistor described in Embodiment 5 or Embodiment 6 by providing the structures 702a, 702b, and 702c. Note that the structures are not limited to the structures 702a, 702b, and 702c. For example, only the structures 702a and 702b may be provided, or four or more structures may be provided.

According to this embodiment, a channel length L' can be made much longer than that of the transistor described in any of Embodiments 1 to 6. Therefore, even when the size of a transistor is reduced, the adverse effect of a short-channel effect can be reduced, and an integration degree of a semiconductor device can be increased. In addition, a semiconductor device with lower power consumption and higher yield can be provided.

Embodiment 8

In this embodiment, an example of manufacturing a semiconductor memory device using the transistor described in any of Embodiments 1 to 7 will be described.

Typical examples of a volatile semiconductor memory device include a DRAM which stores data by selecting a transistor included in a memory element and accumulating electric charge in a capacitor and a static random access memory (SRAM) which holds stored data using a circuit such as a flip-flop.

Typical examples of a nonvolatile semiconductor memory device include a flash memory which has a floating gate between a gate electrode and a channel formation region of a transistor and stores data by holding electric charge in the floating gate.

The transistor described in any of Embodiments 1 to 7 can be applied to part of transistors included in the above-described semiconductor memory device.

First, a memory cell included in a semiconductor memory device to which the transistor described in any of Embodiments 1 to 7 is applied will be described with reference to FIGS. 8A to 8D.

Figure 8A:
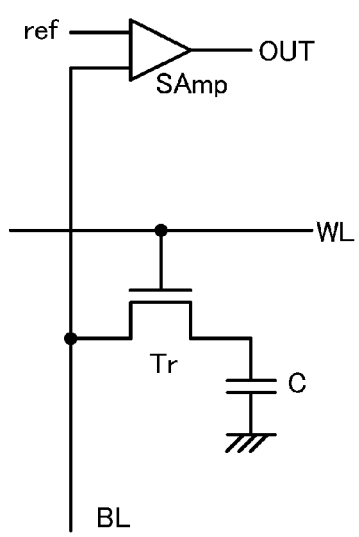
FIG. 8A and FIGS. 8C and 8D are a circuit diagram and cross-sectional views, respectively, illustrating an example of a semiconductor memory device including a transistor which is one embodiment of the present invention.

A memory cell includes a bit line BL, a word line WL, a sense amplifier SAmp, a transistor Tr, and a capacitor C (see FIG. 8A).

Here, when the integration degree of a semiconductor memory device including the memory cell illustrated in FIG. 8A is increased, it is also necessary to reduce the size of the transistor Tr in accordance with the increase. However, when the size of the transistor Tr is simply reduced, a short-channel effect in the transistor Tr cannot be ignored when the size is below a certain degree. This is because a punch-through current is likely to flow due to a short-channel effect and the transistor Tr becomes incapable of functioning as a switching element.

By application of one embodiment of the present invention to the transistor Tr, the area occupied by the transistor Tr can be reduced, and the channel length of the transistor Tr can be increased. Therefore, the integration degree of the semiconductor memory device can be increased.

Figure 8B:
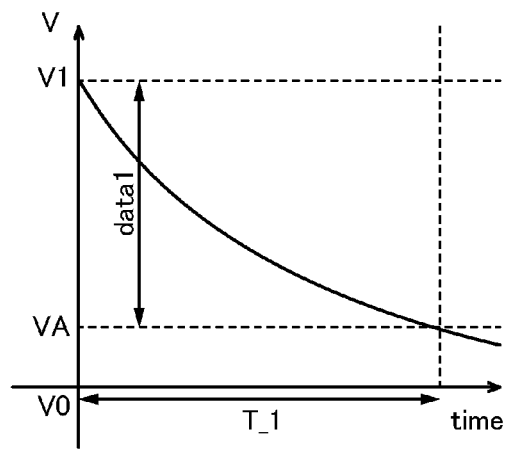
FIG. 8B is a graph showing electric characteristics thereof.

Note that it is known that the potential held in the capacitor is gradually decreased with time as shown in FIG. 8B owing to the off-state current of the transistor Tr. A potential originally charged from V0 to V1 is decreased with time, to VA that is a limit for reading out data 1. This period is called a holding period T_1. In the case of a two-level memory cell, refresh operation needs to be performed within the holding period T_1.

Here, when an oxide semiconductor film is used as a semiconductor film which forms a channel region of the transistor Tr, the holding period T_1 can be increased because off-state current of a transistor including an oxide semiconductor film can be reduced. That is, frequency of the refresh operation can be reduced, which results in a reduction in power consumption. For example, in the case where a memory cell is formed using a transistor including an oxide semiconductor film in which an off-state current is less than or equal to $1\times10^{-21}$ A, preferably less than or equal to $1\times10^{-24}$ A, data can be held for several days to several tens of years without supply of electric power.

Figure 8C:
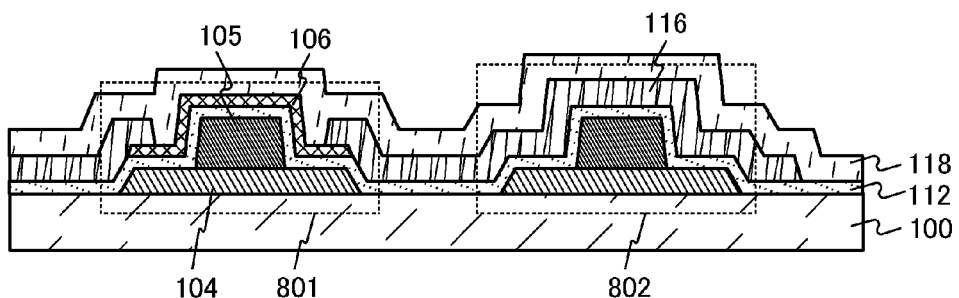
Figure 8D:
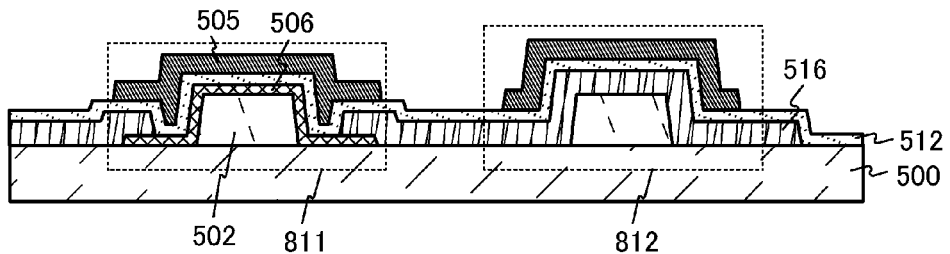

FIGS. 8C and 8D illustrate cross-sectional structures of memory cells formed using the transistor described in Embodiment 1 and the transistor described in Embodiment 5, respectively. Although the transistor described in any of Embodiments 1 to 7 can be used for the memory cells illustrated in FIGS. 8C and 8D, FIGS. 8C and 8D illustrate only the above transistors for simplicity.

FIG. 8C illustrates a cross-sectional structure of a capacitor 802 and a transistor 801 including the semiconductor film 106 provided over the substrate 100. Note that the capacitor 802 includes a first capacitor electrode including a conductive film formed using the same material and in the same layer as the first gate electrode 104 and a conductive film formed using the same material and in the same layer as the second gate electrode 105, a second capacitor electrode connected to one of the pair of electrodes 116, and a dielectric layer formed using the same material and in the same layer as the gate insulating film 112. By application of one embodiment of the present invention not only to the transistor 801 but also to the capacitor 802, a three-dimensional capacitor can be obtained. Accordingly, the area occupied by the capacitor can also be reduced. Note that the protective insulating film 118 is not necessarily provided.

FIG. 8D illustrates a cross-sectional structure of a capacitor 812 and a transistor 811 including the semiconductor film 506 provided over the substrate 500. Note that the capacitor 812 includes a first capacitor electrode formed using the same material and in the same layer as the gate electrode 505, a second capacitor electrode connected to one of the pair of electrodes 516, and a dielectric layer formed using the same material and in the same layer as the gate insulating film 512. By application of one embodiment of the present invention not only to the transistor 811 but also to the capacitor 812, a three-dimensional capacitor can be obtained. Accordingly, the area occupied by the capacitor can also be reduced.

As described above, one embodiment of the present invention can be applied to the capacitor. Although not illustrated, the above structures of the capacitors may be applied to the other embodiments.

As described above, according to one embodiment of the present invention, a semiconductor memory device with high reliability for a long time and low power consumption, in which a short-channel effect is reduced even when the integration degree is increased, can be obtained.

Next, a semiconductor memory device to which the transistor described in any of Embodiments 1 to 7 is applied will be described with reference to FIGS. 9A and 9B.

Figure 9A:
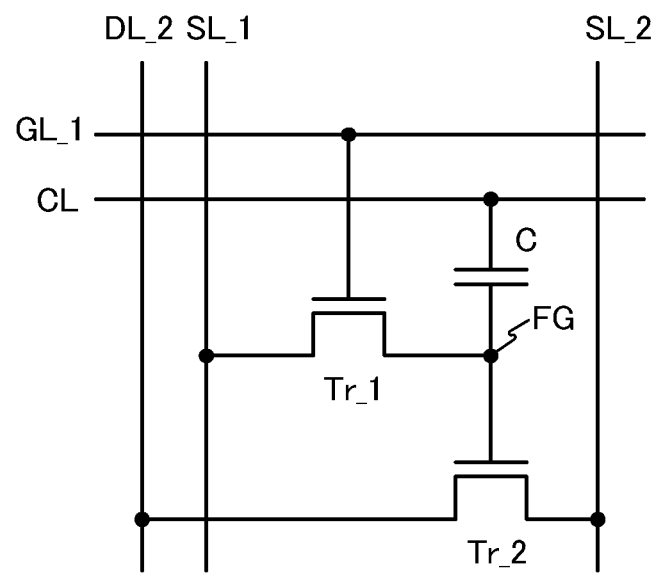
FIG. 9A is a circuit diagram illustrating an example of a semiconductor memory device including a transistor which is one embodiment of the present invention.

FIG. 9A is a circuit diagram of a memory cell included in a semiconductor memory device. A memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node FG connected to the other terminal of the capacitor C, a drain of the transistor Tr_1, and a gate of the transistor Tr_2.

When the integration degree of a semiconductor memory device including the memory cell illustrated in FIG. 9A is increased as in the memory cell illustrated in FIG. 8A, it is also necessary to reduce the sizes of the transistors Tr_1 and Tr_2 in accordance with the increase. The number of transistors in the memory cell illustrated in FIG. 9A is larger than that in the memory cell illustrated in FIG. 8A; therefore, it is more important to reduce the size of the transistor in order to increase the integration degree.

By application of one embodiment of the present invention to the transistors Tr_1 and Tr_2, the area occupied by the transistors Tr_1 and Tr_2 can be reduced, and the channel lengths of the transistors Tr_1 and Tr_2 can be increased. Therefore, the integration degree of the semiconductor memory device including the memory cell illustrated in FIG. 9A can be increased.

Figure 9B:
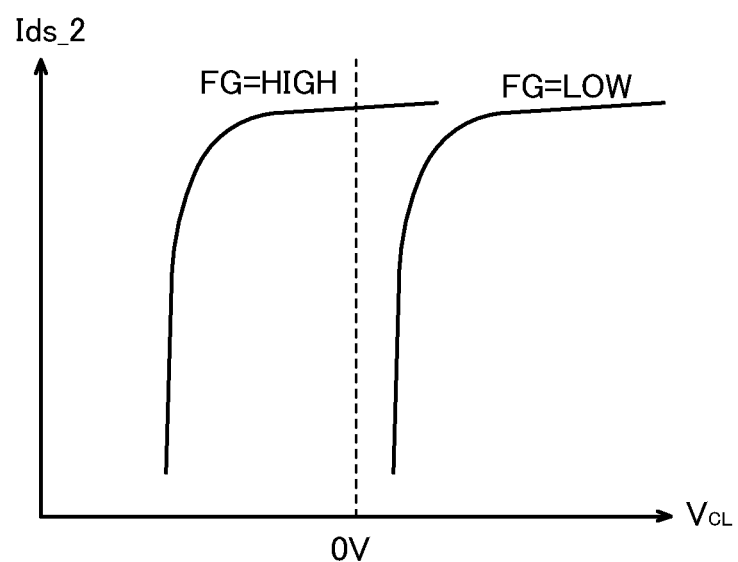
FIG. 9B is a graph showing electric characteristics thereof.

The semiconductor memory device including the memory cell illustrated in FIG. 9A utilizes change in the threshold voltage of the transistor Tr_2, which depends on the potential of the node FG FIG. 9B shows a relation between a potential $V_{CL}$ of the capacitor line CL and a drain current Ids_2 flowing through the transistor Tr_2.

Here, the potential of the node FG can be adjusted through the transistor Tr_1. For example, the potential of the source line SL_1 is set to VDD. In this case, when the potential of the gate line GL_1 is set to be higher than or equal to a potential obtained by adding VDD to the threshold voltage Vth of the transistor Tr_1, the potential of the node FG can be HIGH. Further, when the potential of the gate line GL_1 is set to be lower than or equal to the threshold voltage Vth of the transistor Tr_1, the potential of the node FG can be LOW.

Thus, either a $V_{CL}$-Ids_2 curve (FG=LOW) or a $V_{CL}$-Ids_2 curve (FG=HIGH) can be obtained. That is, when FG=LOW, Ids_2 is small at a $V_{CL}$ of 0V; accordingly, data 0 is stored. Further, when FG=HIGH, Ids_2 is large at a $V_{CL}$ of 0V; accordingly, data 1 is stored. In such a manner, data can be stored.

Here, when a transistor in which an oxide semiconductor film is used as a semiconductor film which forms a channel region is used as the transistor Tr_1, the off-state current of the transistor can be extremely small; therefore, unintentional leakage of electric charge accumulated in the node FG through the transistor Tr_1 can be suppressed. As a result, data can be held for a long time.

Note that as the transistor Tr_2, a transistor in which an oxide semiconductor film is used as a semiconductor film which forms a channel region may be used.

Next, a structure of the memory cell illustrated in FIG. 9A without the capacitor will be described with reference to FIG. 10.

Figure 10:
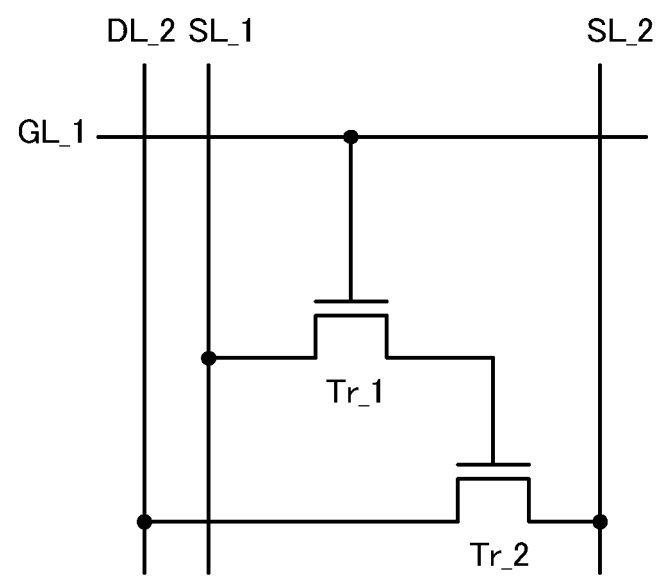
FIG. 10 is a circuit diagram illustrating an example of a semiconductor memory device including a transistor which is one embodiment of the present invention.

FIG. 10 is a circuit diagram of a memory cell included in a semiconductor memory device. A memory cell includes a transistor Tr_, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, and a gate of the transistor Tr_2, which is connected to a drain of the transistor Tr_1.

When an oxide semiconductor film is used as a semiconductor film which forms a channel region of the transistor Tr_1, electric charge can be held between the drain of the transistor Tr_1 and the gate of the transistor Tr_2 without a capacitor. The configuration without a capacitor makes it possible to reduce the area of a memory cell, and the integration degree of the semiconductor memory device can be more increased than that in the configuration with a capacitor.

When the integration degree of the semiconductor memory device is increased, it is also necessary to reduce the sizes of the transistors Tr_1 and Tr_2 in accordance with the increase. With the configuration without a capacitor, the proportion of the transistors to the semiconductor memory device gets larger; accordingly, it is more important to reduce the sizes of the transistors.

By application of one embodiment of the present invention to the transistors Tr_1 and Tr_2, the channel lengths of the transistors Tr_1 and Tr_2 can be increased even when the areas occupied by the transistors Tr_1 and Tr_2 are reduced. Therefore, the integration degree of the semiconductor memory device can be increased.

Although a mode in which four or five wirings are used is described in this embodiment, a configuration of the memory cell is not limited thereto. For example, a configuration in which one wiring functions as the source line SL_1 and the drain line DL_2 may be employed.

As described above, according to one embodiment of the present invention, a semiconductor memory device with high reliability for a long time and low power consumption, in which a short-channel effect is reduced even when the integration degree is increased, can be obtained.

This embodiment can be implemented in appropriate combination with the other embodiments.

Embodiment 9

A central processing unit (CPU) can be formed by applying at least one of Embodiments 1 to 8 to part of the CPU.

Figure 11A:
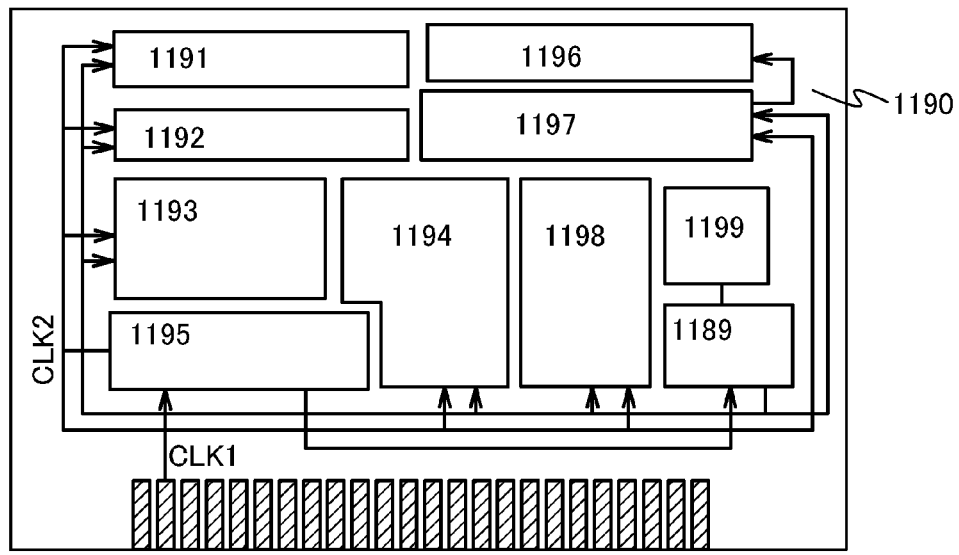
FIG. 11A is a block diagram illustrating a specific example of a CPU including a transistor which is one embodiment of the present invention.

FIG. 11A is a block diagram illustrating a specific configuration of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 11A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generation portion for generating an internal clock signal CLK2 based on a reference clock signal CLK1, and supplies the clock signal CLK2 to the above circuits.

In the CPU illustrated in FIG. 11A, a memory element is provided in the register 1196. The memory element described in Embodiment 8 can be used as the memory element provided in the register 1196.

In the CPU illustrated in FIG. 11A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 11B:
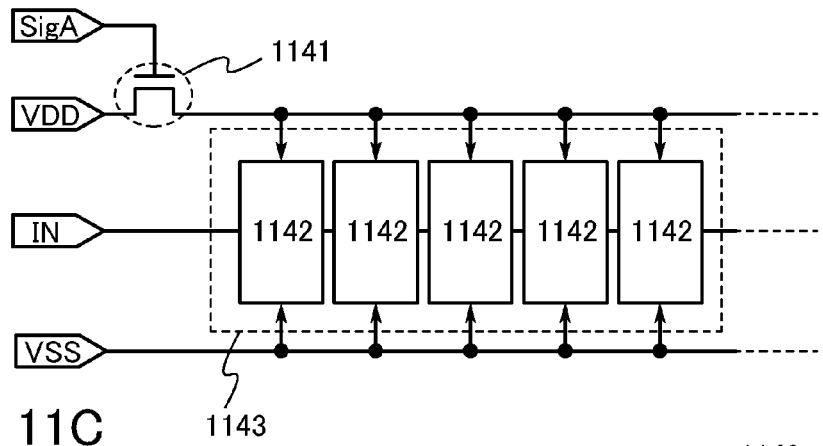
FIGS. 11B and 11C are circuit diagrams each illustrating part of the CPU.
Figure 11C:
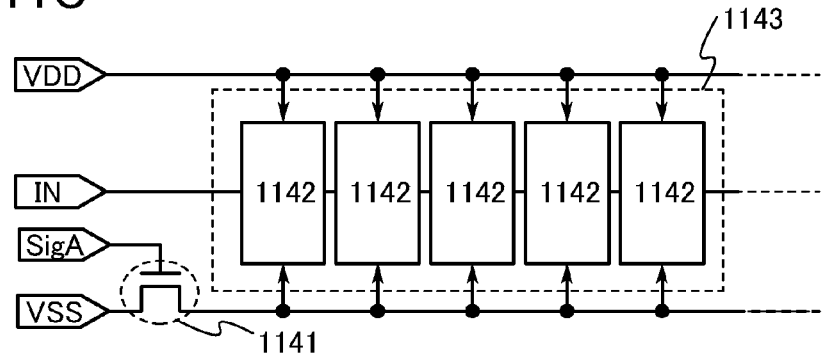

The supply of the power supply voltage can be stopped by providing a switching element between a memory element group and a node to which a power supply potential VDD or a power supply potential VSS is supplied, as illustrated in FIG. 11B or FIG. 11C. Circuits illustrated in FIGS. 11B and 11C will be described below.

In each of FIGS. 11B and 11C, as a switching element for controlling supply of a power supply potential to a memory element, an example of a configuration of a memory circuit including a transistor in which an oxide semiconductor is used for an active layer is illustrated.

The memory device illustrated in FIG. 11B includes a switching element 1141 and a memory element group 1143 including a plurality of memory elements 1142. Specifically, as each of the memory elements 1142, the memory element described in Embodiment 8 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 11B, the transistor in which an oxide semiconductor is used for the active layer is used as the switching element 1141, and the switching of the transistor is controlled by a signal SigA supplied to a gate electrode thereof.

Note that FIG. 11B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 11B, the switching element 1141 may control the supply of the low-level power supply potential VSS.

In FIG. 11C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where a switching element is provided between a memory element group and a node to which the power supply potential VDD or the power supply potential VSS is supplied, an operation of a CPU is temporarily stopped, and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

At least one of Embodiments 1 to 8 is applied to the CPU, whereby the integration degree of the CPU can be increased. In addition, the power consumption of the CPU can be reduced.

This embodiment can be implemented in appropriate combination with the other embodiments.

Embodiment 10

In this embodiment, a liquid crystal display device manufactured using the transistor described in any of Embodiments 1 to 7 will be described. Note that although an example in which one embodiment of the present invention is applied to the liquid crystal display device is described in this embodiment, the present invention is not limited thereto. For example, application of one embodiment of the present invention to an electroluminescence (EL) display device is readily conceived by those skilled in the art.

Figure 12:
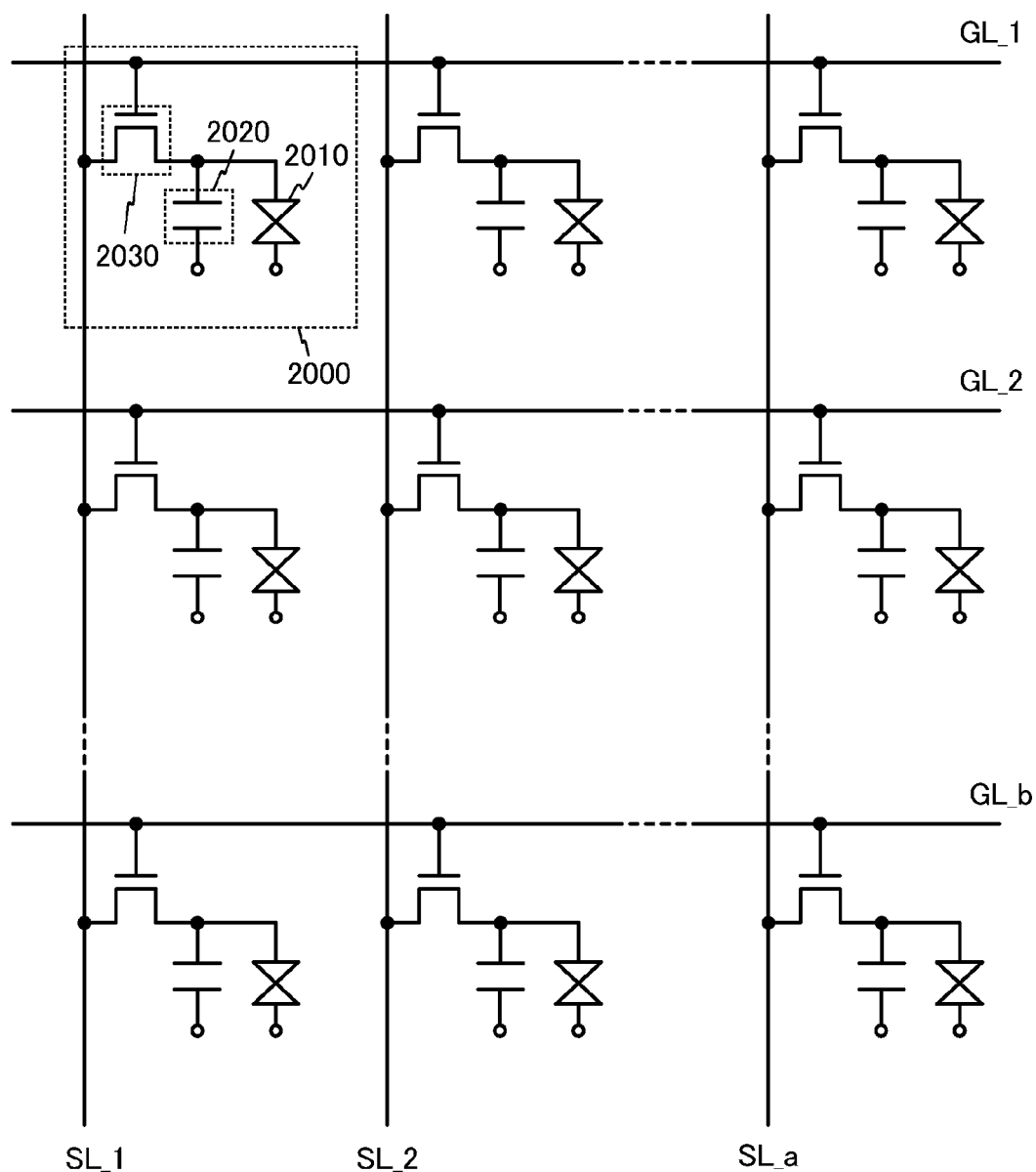
FIG. 12 is a circuit diagram illustrating an example of a display device including a transistor which is one embodiment of the present invention.

FIG. 12 is a circuit diagram of an active matrix liquid crystal display device. The liquid crystal display device includes source lines SL_1 to SL_a, gate lines GL_1 to GL_b, and a plurality of pixels 2000. Each pixel 2000 includes a transistor 2030, a capacitor 2020, and a liquid crystal element 2010. A plurality of the pixels 2000 with such a structure forms a pixel portion of the liquid crystal display device. In the case where the source line or the gate line is simply mentioned, it is denoted as the source line SL or the gate line GL.

The transistor described in any of Embodiment 1 to 7 is used as the transistor 2030. With the use of the transistor which is one embodiment of the present invention, a display device having a high aperture ratio can be obtained because an area occupied by the transistor is reduced. This advantageous effect is enhanced when the number of pixels is large.

The gate line GL is connected to a gate of the transistor 2030, the source line SL is connected to a source of the transistor 2030, and a drain of the transistor 2030 is connected to one of capacitor electrodes of the capacitor 2020 and one of pixel electrodes of the liquid crystal element 2010. The other of the capacitor electrodes of the capacitor 2020 and the other of the pixel electrodes of the liquid crystal element 2010 are each connected to a common electrode. Note that the common electrode may be formed using the same material and in the same layer as the gate line GL.

Further, the gate line GL is connected to a gate driver circuit. The gate driver circuit may include the transistor described in any of Embodiments 1 to 7. The area occupied by a transistor can be reduced with the use of the above transistor, whereby the frame area of the display device can be reduced. Further, power consumption can be reduced.

The source line SL is connected to a source driver circuit. The source driver circuit may include the transistor described in any of Embodiments 1 to 7. The area occupied by a transistor can be reduced with the use of the above transistor, whereby the frame area of the display device can be reduced. Further, power consumption can be reduced.

One of or both of the gate driver circuit and the source driver circuit may be formed separately and connected by a connection method such as a chip on glass (COG) method, a wire bonding method, or a tape automated bonding (TAB) method.

Since a transistor is easily broken by static electricity or the like, a protection circuit is preferably provided. The protection circuit is preferably formed using a nonlinear element.

When a potential that is higher than or equal to the threshold voltage of the transistor 2030 is applied to the gate line GL, electric charge supplied from the source line SL flows as a drain current of the transistor 2030 and is accumulated in the capacitor 2020. After charging for one row, the transistors 2030 in the row are turned off and voltage application from the source line SL stops; however, a necessary voltage can be kept by the electric charge accumulated in the capacitors 2020. Then, charging of the capacitors 2020 in the next row is carried out. In this manner, charging for the first row to the b-th row is carried out.

In the case of using an oxide semiconductor film as a semiconductor film which forms a channel region of the transistor 2030, the period of time for which the voltage is kept can be lengthened. By this advantageous effect, the frequency of rewriting display can be reduced in the case of an image with little motion (including a still image); thus, a reduction in power consumption can be achieved. In addition, the capacitance of the capacitor 2020 can be further reduced, so that power consumption needed for charging can be reduced.

As described above, according to one embodiment of the present invention, a liquid crystal display device having a high aperture ratio, high reliability, and low power consumption can be obtained.

This embodiment can be implemented in appropriate combination with the other embodiments.

Embodiment 11

In this embodiment, examples of an electronic device to which any of Embodiments 1 to 10 is applied will be described.

Figure 13A:
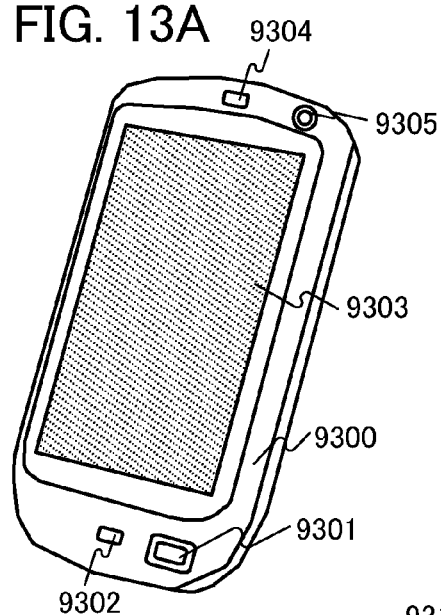
FIGS. 13A to 13C are perspective views illustrating examples of electronic devices according to one embodiment of the present invention.

FIG. 13A illustrates a portable information terminal. The portable information terminal includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit in a main body.

Figure 13B:
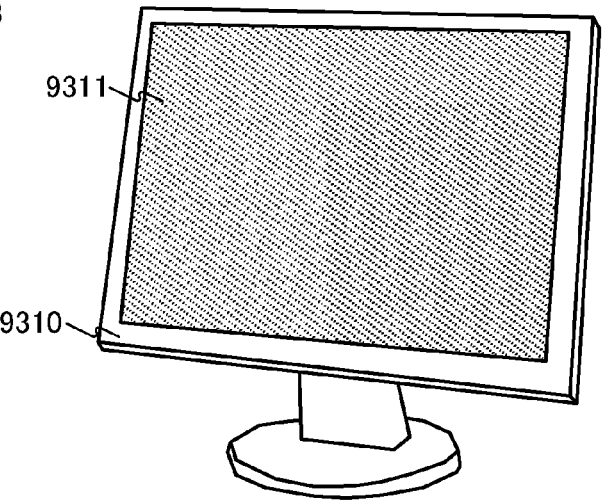

FIG. 13B illustrates a display, which includes a housing 9310 and a display portion 9311. One embodiment of the present invention can be applied to the display portion 9311. By application of one embodiment of the present invention, a display having low power consumption can be provided even when the number of pixels in the display portion 9311 is increased.

Figure 13C:
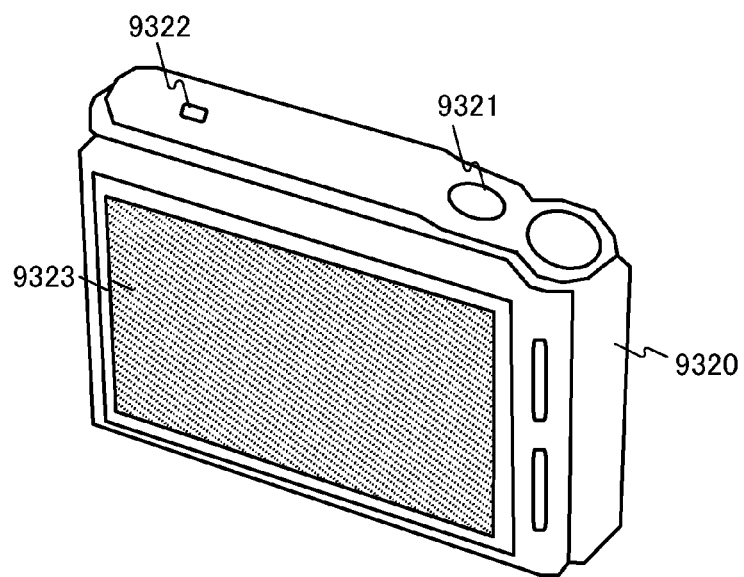

FIG. 13C illustrates a digital still camera. The digital still camera includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

By application of one embodiment of the present invention, cost of an electronic device can be reduced. Further, an electronic device having low power consumption can be provided.

This embodiment can be implemented in appropriate combination with the other embodiments.

This application is based on Japanese Patent Application Serial No. 2011-037952 filed with Japan Patent Office on Feb. 24, 2011, the entire contents of which are hereby incorporated by reference.

What is claimed is:

1. A method for manufacturing a semiconductor device, comprising the steps of:
    forming a gate electrode;
    forming a gate insulating film over the gate electrode;
    forming a semiconductor film which is over the gate insulating film; and
    forming a pair of electrodes over the gate insulating film so that the pair of electrodes does not overlap with the gate electrode and is in contact with the semiconductor film,
    wherein a thickness of the gate electrode is selected so that a channel length is three times or more as long as an apparent channel length which is a distance between the pair of electrodes when seen from above.

2. The method for manufacturing a semiconductor device, according to claim 1,
    wherein the pair of electrodes is formed over the semiconductor film.

3. The method for manufacturing a semiconductor device, according to claim 1,
    wherein an oxide semiconductor film is formed as the semiconductor film.

4. The method for manufacturing a semiconductor device, according to claim 1,
    wherein a plasma treatment is performed on at least one of the pair of electrodes and the gate electrode.

5. The method for manufacturing a semiconductor device, according to claim 4,
    wherein the plasma treatment is a reverse sputtering treatment.

6. A method for manufacturing a semiconductor device, comprising the steps of:
    forming a first gate electrode;

forming a second gate electrode over the first gate electrode so that a top surface of the second gate electrode is smaller than a top surface of the first gate electrode;

forming a gate insulating film over the second gate electrode;

forming a semiconductor film which is over the gate insulating film; and forming a pair of electrodes over the gate insulating film so that the pair of electrodes does not overlap with the second gate electrode and is in contact with the semiconductor film, wherein a thickness of the first gate electrode is selected so that a channel length is three times or more as long as an apparent channel length which is a distance between the pair of electrodes when seen from above.

7. The method for manufacturing a semiconductor device, according to claim 6, wherein the pair of electrodes is formed over the semiconductor film.

8. The method for manufacturing a semiconductor device, according to claim 6, wherein an oxide semiconductor film is formed as the semiconductor film.

9. The method for manufacturing a semiconductor device, according to claim 6, wherein a plasma treatment is performed on at least one of the pair of electrodes, the first gate electrode and the second gate electrode.

10. The method for manufacturing a semiconductor device, according to claim 9, wherein the plasma treatment is a reverse sputtering treatment.

11. A method for manufacturing a semiconductor device, comprising the steps of:

forming a structure comprising an insulating surface;

forming a semiconductor film over the structure;

forming a pair of electrodes over the insulating surface so that the pair of electrodes does not overlap with a gate electrode and is in contact with the semiconductor film;

forming a gate insulating film over the structure; and forming the gate electrode over the gate insulating film, wherein a thickness of the structure is selected so that a channel length is three times or more as long as an apparent channel length which is a distance between the pair of electrodes when seen from above.

12. The method for manufacturing a semiconductor device, according to claim 11, wherein the pair of electrodes is formed over the semiconductor film.

13. The method for manufacturing a semiconductor device, according to claim 11, wherein an oxide semiconductor film is formed as the semiconductor film.

14. The method for manufacturing a semiconductor device, according to claim 11, wherein a plasma treatment is performed on at least one of the pair of electrodes, the structure and the gate electrode.

15. The method for manufacturing a semiconductor device, according to claim 14, wherein the plasma treatment is a reverse sputtering treatment.

* * * * *